United States Patent
Ono et al.

(10) Patent No.: US 8,436,348 B2
(45) Date of Patent: May 7, 2013

(54) ORGANIC EL DISPLAY PANEL, ORGANIC EL DISPLAY DEVICE HAVING THE SAME, AND METHOD FOR MANUFACTURING ORGANIC EL DISPLAY PANEL

(75) Inventors: Shinya Ono, Osaka (JP); Seiji Nishiyama, Osaka (JP); Hidehiro Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 6 days.

(21) Appl. No.: 13/288,446

(22) Filed: Nov. 3, 2011

(65) Prior Publication Data
US 2012/0049175 A1    Mar. 1, 2012

Related U.S. Application Data

(63) Continuation of application No. PCT/JP2010/002805, filed on Apr. 19, 2010.

(51) Int. Cl.
*H01L 27/32*    (2006.01)
*H01L 51/56*    (2006.01)

(52) U.S. Cl.
USPC  257/40; 257/59; 257/E27.119; 257/E51.018; 438/34; 438/82; 438/99; 345/76; 345/204

(58) Field of Classification Search .......... 257/40, 257/59, E27.119, E51.018; 438/34, 82, 99; 345/76, 204
See application file for complete search history.

(56) References Cited

U.S. PATENT DOCUMENTS

| | | | |
|---|---|---|---|
| 5,443,922 A | 8/1995 | Nishizaki et al. | |
| 6,057,647 A * | 5/2000 | Kurosawa et al. | 315/169.3 |
| 6,784,878 B2 * | 8/2004 | Hanari et al. | 345/204 |
| 6,828,727 B2 * | 12/2004 | Yamazaki | 313/509 |
| 7,122,957 B2 | 10/2006 | Duineveld et al. | |
| 7,683,537 B2 | 3/2010 | Yoshida et al. | |
| 7,842,947 B2 | 11/2010 | Yoshida et al. | |
| 7,888,867 B2 | 2/2011 | Yoshida et al. | |

(Continued)

FOREIGN PATENT DOCUMENTS

| | | |
|---|---|---|
| JP | 51-63488 | 6/1993 |
| JP | 2004-514256 | 5/2004 |

(Continued)

OTHER PUBLICATIONS

International Search Report in PCT/JP2010/002805, mailing date of May 25, 2010.

*Primary Examiner* — Thinh T Nguyen
(74) *Attorney, Agent, or Firm* — Greenblum & Bernstein, P.L.C.

(57) ABSTRACT

An organic EL display panel includes a wiring layer, a planarizing film above the wiring layer, and a plurality of light-emitting cells in a row. A pair of first banks are above the planarizing film to delimit lateral surfaces of the light-emitting cells. The planarizing film includes a plurality of recesses that are each formed between adjacent ones of the light-emitting cells and extend between the first banks. A plurality of organic light-emitting layers are each in one of the light-emitting cells between the pair of first banks. A plurality of second banks are connected to the first banks, and each comprise a same material as the first banks. Each of the second banks is above one of the recesses and has a shape that conforms to a profile of the one of the recesses so that the second banks are lower in height than the first banks.

29 Claims, 21 Drawing Sheets

| U.S. PATENT DOCUMENTS | | | | FOREIGN PATENT DOCUMENTS | | |
|---|---|---|---|---|---|---|
| 2002/0060518 A1 | 5/2002 | Duineveld et al. | | JP | 2004-288403 | 10/2004 |
| 2009/0160322 A1 | 6/2009 | Yoshida et al. | | JP | 2007-311235 | 11/2007 |
| 2010/0194269 A1 | 8/2010 | Sonoda et al. | | JP | 2009-200049 | 9/2009 |
| 2010/0213827 A1 | 8/2010 | Yoshida et al. | | WO | 2009/028126 | 3/2009 |
| 2011/0180821 A1 | 7/2011 | Matsushima | | WO | 2009/084209 | 7/2009 |
| 2011/0187267 A1 | 8/2011 | Yamamoto et al. | | WO | 2010/032514 | 3/2010 |
| 2011/0198623 A1 | 8/2011 | Matsushima | | | | |
| 2011/0198624 A1 | 8/2011 | Matsushima | | | | |

* cited by examiner

FIG. 10
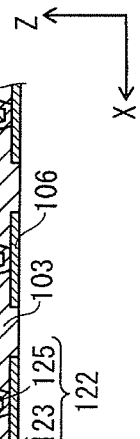
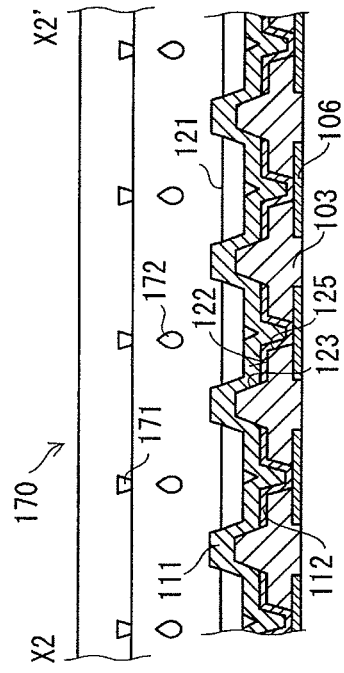
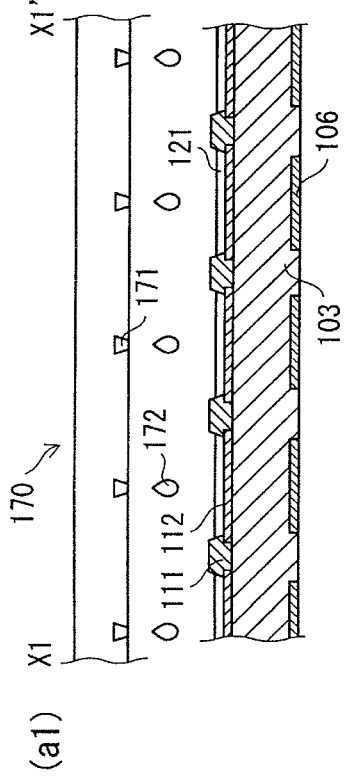
(a1)
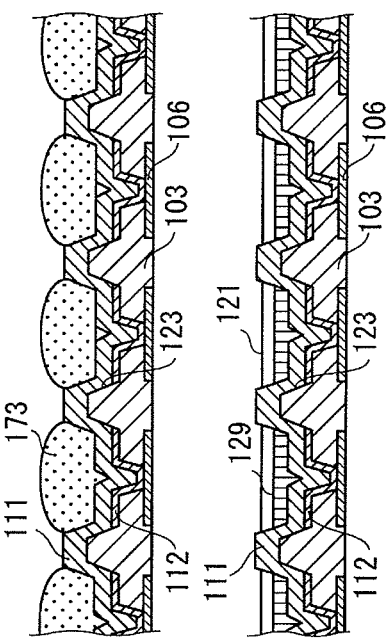
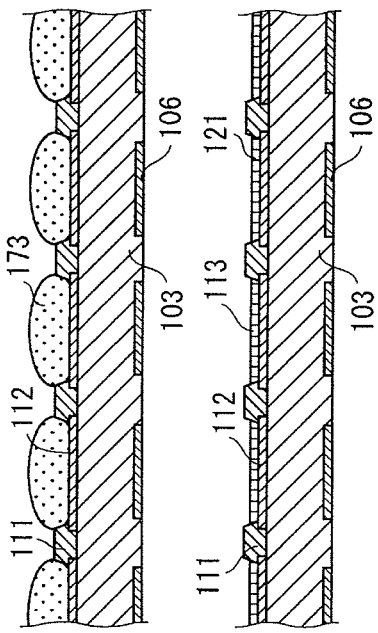
(b1)
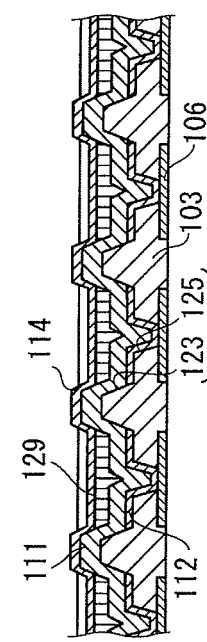
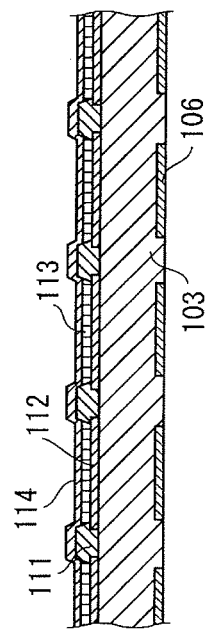
(c1)
(d1)
(a2)
(b2)
(c2)
(d2)

FIG. 13
(a)
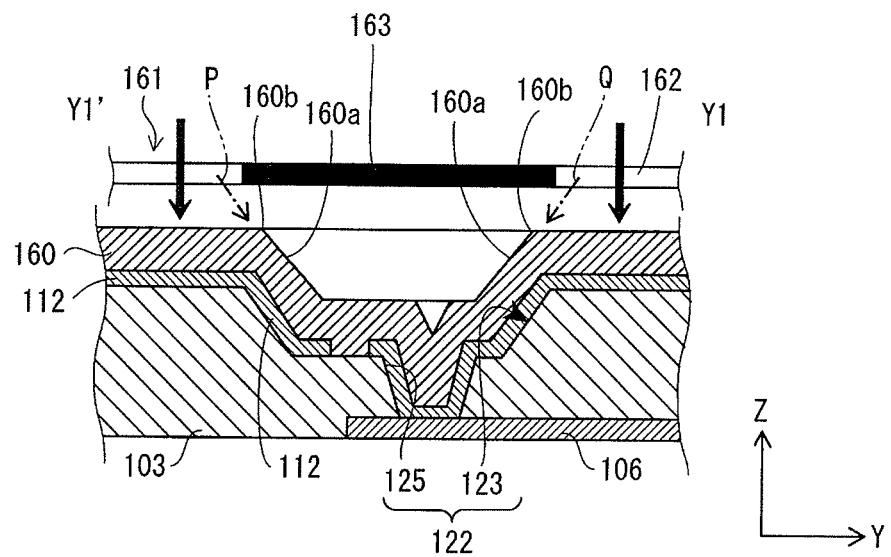
(b)
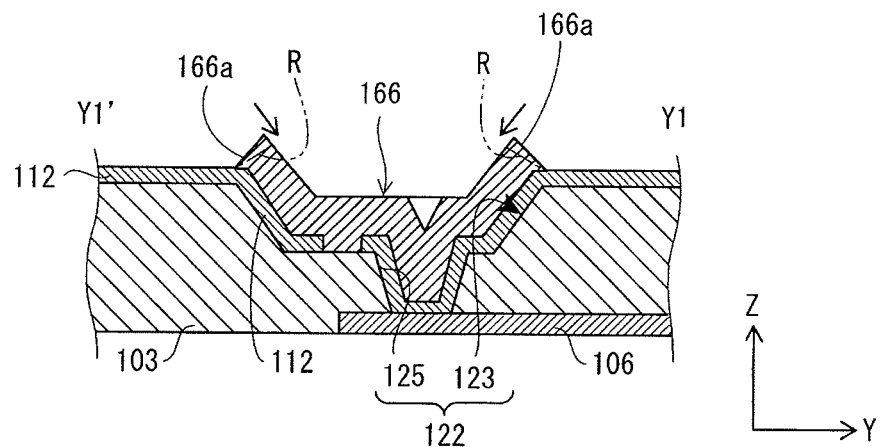

ORGANIC EL DISPLAY PANEL, ORGANIC EL DISPLAY DEVICE HAVING THE SAME, AND METHOD FOR MANUFACTURING ORGANIC EL DISPLAY PANEL

CROSS REFERENCE TO RELATED APPLICATION

This is a continuation application of PCT Application No. PCT/JP10/002805 filed Apr. 19, 2010, designating the United States of America, the disclosure of which, including the specification, drawings and claims, is incorporated herein by reference in its entirety.

BACKGROUND OF THE INVENTION

1. Field of the Invention

The present invention relates to an organic EL display panel, an organic EL display device having the same, and a method for manufacturing an organic EL display panel.

2. Description of the Related Art

In recent years, research and development of organic EL display panels that use the phenomenon of electroluminescence occurring in organic material (hereinafter, simply "display panels") have progressed. Each light-emitting cell of such a display panel has an anode, a cathode, and an organic light-emitting layer interposed between the anode and the cathode. When the display panel is driven, light is produced upon recombination of holes and electrons that are injected into the organic light-emitting layer through the anode and cathode, respectively.

Examples of methods for manufacturing such organic light-emitting layers include an evaporation method and a printing method. Especially when an ink-jet method, which is a type of printing method, is employed to form light-emitting layers and other layers, adjacent pixels need to be separated by banks (partitions) made from e.g., insulating material to avoid mixing of ink drops of different colors (color mixture). Schemes known for forming such banks include: a line-bank scheme according to which a plurality of banks are formed in parallel lines to separate organic light-emitting layers into stripes; and a pixel-bank scheme according to which banks are formed into a grid (lattice) pattern to enclose individual pixels with the banks.

With the line-bank scheme, when material for forming organic light-emitting layers is applied using a printing method such as an ink-jet method, the material flows across a plurality of light-emitting cells, so that the organic light-emitting layers in the respective light-emitting cells are ensured to be uniform in thickness. However, the line-bank scheme requires to additionally provide cell-defining layers traversing the banks arranged in lines. The cell-defining layers are provided to control emission of light at an edge portion of each light-emitting cell, so that the individual light-emitting cells aligned along the banks are separated. That is to say, a process of forming the cell-defining layers needs to be added to the entire process of forming organic EL elements, which gives a rise to a problem of increasing the manufacturing cost.

With the pixel-bank scheme, on the other hand, no additional layers such as the cell-defining layers mentioned above are necessary. Thus, the problem about the manufacturing cost is duly addressed. Yet, since the individual light-emitting cells are discretely separated, when material for forming organic light-emitting layers is applied using a printing method such as an ink jet method, the material cannot flow across a plurality of light-emitting cells. Thus, it is difficult to ensure that the organic light-emitting layers in the respective light-emitting cells are uniform in thickness.

Patent Literature 1 is one example showing a technique employing the line-bank scheme. According to Patent Literature 1, cell-defining layers made from insulating material are disposed between light-emitting cells adjacent in the direction in which the banks extend, so that interference of light emission between adjacent pixels is prevented. The cell-defining layers may be composed of the same material as the banks. The cell-defining layers composed of such material are referred to as "auxiliary banks (partitions)". The cell-defining layers are formed to be lower in height than the line banks, so that ink is allowed to flow in the direction in which the banks extend. Consequently, the amount of ink is ensured to be uniform among a plurality of light-emitting cells.

3. Patent Literature

[Patent Literature 1]: JP Patent Application Publication No. 2009-200049

SUMMARY OF THE INVENTION

However, the conventional techniques noted above are associated with problems including the following.

Patent literature 1 discloses a method for simultaneously forming first and second banks of different heights by using, for example, a half-tone mask so that regions of a bank material where the first and second banks are to be formed are exposed to different amounts of light.

However, it is practically difficult for preparing a bank material suitable for forming banks through the use of e.g., a half-tone mask, so that the method mentioned above is of little practical use. More specifically, a bank material is required to have various properties such as photosensitivity to light in the process of forming banks, resistance during the firing (baking) process and the like, water repellency (including the water repellency after fluoridation process), and insulating property. Therefore, it is difficult to additionally meet a requirement to be suitable as a material for forming banks with the use of a half-tone mask, for example. In view of the above, there is a demand for display panels or the like having a configuration allowing first and second banks of different heights to be formed simultaneously, without concern for the requirements for the bank material.

The present invention is made in order to address the problems noted above and aims to provide an organic EL display device and a manufacturing method for the same in which the line-bank scheme is employed in a manner to allow banks of two different heights to be simultaneously formed through the same processing step(s), with little requirements for the bank material.

In order to address the above problems, an organic EL display panel according to one aspect of the present invention includes: a wiring layer; a planarizing film disposed above the wiring layer; a pair of first banks disposed above the planarizing film to delimit lateral surfaces of a plurality of light-emitting cells in a row; a plurality of organic light-emitting layers each disposed in the individual light-emitting cells lying between the pair of first banks; and a plurality of second banks. The planarizing film has a plurality of recesses each formed in a boundary region between adjacent light-emitting cells to extend across the boundary region in a direction intersecting the pair of first banks. The first and second banks are made from a same material and connected to one another. Each second bank is disposed above one of the recesses in the planarizing film and has a shape conforming to an inner profile of the recess, so that the second banks are lower in height than the first banks.

In the organic EL display panel according to the above aspect of the present invention, the planarizing film has the recesses each formed in the boundary region between adjacent light-emitting cells to extend transversely across the boundary region in a direction intersecting the pair of first banks (which may be referred to also as a "pair of first partitions"). Since each second bank (which may be referred to also as a "second partition") is formed above a recess, the second bank conforms in shape to the inner profile of the recess. As a result, the second banks are formed to be lower in height than the first banks.

By the above configuration, the presence of the recesses ensures that the second banks are lower in height than the first banks. That is, for example, even with exposure to the same amount of light, the first and second banks are duly formed at the same time. Consequently, it is no longer required for the bank material to have a property to be suitable for the formation of banks with the use of a half-tone mask. By virtue of this, a bank material is selectable from a wider variety of options. In short, the organic EL display panel according to the above aspect of the present invention has two different types of banks having mutually different heights. The banks are formed through the same processing step(s) according to a line-bank scheme, without being bound by the requirements for the bank material and with a highly practical scheme.

Further, even if the line-bank scheme is used, the second banks partition an array of light-emitting cells, which are commonly delimited by the pair of first banks, into individual light-emitting cells. That is, the second banks function in the same manner as cell-defining layers. Consequently, the cell defining layers are no longer required even in a line-bank scheme.

BRIEF DESCRIPTION OF THE DRAWINGS

FIG. 10 shows schematic cross-sections illustrating steps of an organic light-emitting layer forming process in the manufacturing method for the image display unit 10.

FIG. 13 shows schematic cross-sections illustrating, in more detail, some of the steps of the bank forming process in the manufacturing method of the image display unit 10.

DESCRIPTION OF THE PREFERRED EMBODIMENT(S)

Figure 1:
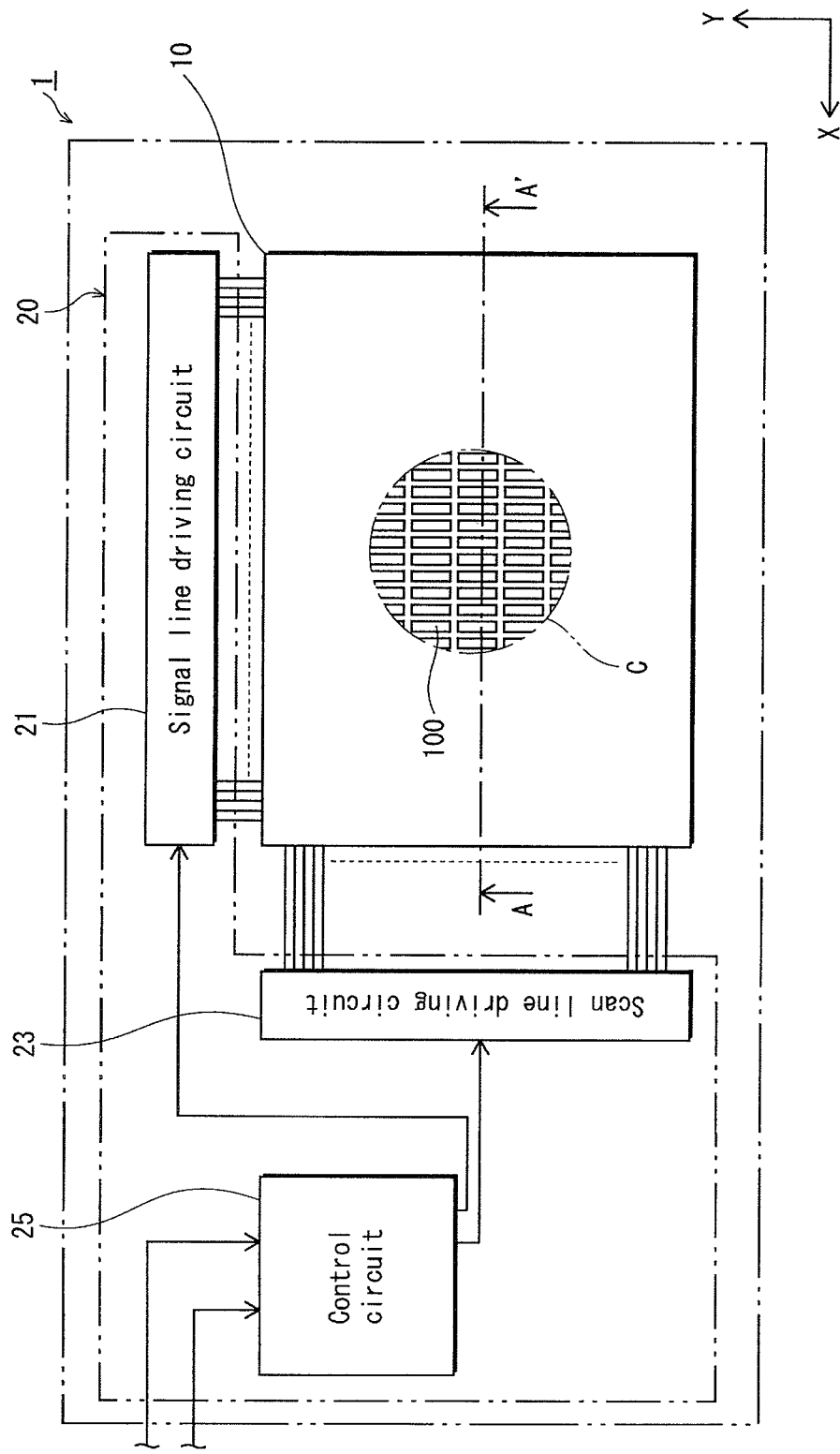
FIG. 1 is a block diagram showing a configuration of an organic EL display panel 1 according to an embodiment of the present invention.

An organic EL display panel according to one aspect of the present invention includes: a wiring layer; a planarizing film disposed above the wiring layer; a pair of first banks disposed above the planarizing film to delimit lateral surfaces of a plurality of light-emitting cells in a row; a plurality of organic light-emitting layers each disposed in the individual light-emitting cells lying between the pair of first banks; and a plurality of second banks. The planarizing film has a plurality of recesses each formed in a boundary region between adjacent light-emitting cells to extend across the boundary region in a direction intersecting the pair of first banks. The first and second banks are made from a same material and connected to one another. Each second bank is disposed above one of the recesses in the planarizing film and has a shape conforming to an inner profile of the recess, so that the second banks are lower in height than the first banks.

In the organic EL display panel according to the above aspect of the present invention, the planarizing film has the recesses each formed in the boundary region between adjacent light-emitting cells to extend transversely across the boundary region in a direction intersecting the pair of first banks (which may be referred to also as a "pair of first partitions"). Since each second bank (which may be referred to also as a "second partition") is formed above a recess, the second bank conforms in shape to the inner profile of the recess. As a result, the second banks are formed to be lower in height than the first banks.

In the above-described manner, the presence of the recesses ensures that the second banks are lower in height than the first banks. That is, for example, by exposure to the same amount of light, the first and second banks are duly formed at the same time. Consequently, it is no longer required for the bank material to have a property to be suitable for the formation of banks with the use of a half-tone mask. By virtue of this, a bank material is selectable from a wider variety of options. In short, the organic EL display panel according to the above aspect of the present invention has two different types of banks having mutually different height. The banks are formed through the same processing step(s) according to a line-bank scheme, without being bound by the requirements for the bank material and with a highly practical scheme.

Further, even if the line-bank scheme is used, the second banks partition an array of light-emitting cells, which are commonly delimited by the pair of first banks, into individual light-emitting cells. That is, the second banks function in the same manner as cell-defining layers. Consequently, the cell defining layers are no longer required even in a line-bank scheme.

Further, the organic EL display panel according to the above aspect of the present invention is formed by using a line-bank scheme and has the second banks that are lower in height than the first banks. By virtue of the above configuration, the following is ensured at the time of forming organic light-emitting layers. That is, when ink containing an organic light-emitting material is applied by a printing method such as an ink jet method, the ink flows across a plurality of light-emitting cells lying between the first banks. Consequently, the organic light-emitting layers are formed in uniform thickness.

Each recess may have a top opening that opens into the upper surface of the planarizing film (i.e., the surface facing toward an organic light-emitting layer) but without a bottom opening that opens into the lower surface of the planarizing film (i.e., the surface facing toward the wiring layer). Alternatively, each recess may have both the top and bottom openings.

In the case where each recess is without a bottom opening, a contact hole is formed in a region different from a region where the recess is formed. Note that the contact holes are readily formed at the same time with the recesses and flat surface portions, which are at different heights, through the light exposure process using a multi-tone mask, for example.

In the case where each recess has both the top opening and the bottom opening, each recess may be formed to have a step (step height), for example. Then, the portion of the recess below the step is formed to be a contact hole. As described above, with the use of a multi-tone mask, for example, the recesses each having a step may be readily formed at the same time with the flat surface portions of the planarizing film.

Unlike the bank material, the planarizing film is not required to have multiple functions. Thus, any photosensitive material that is suitably used with a multi-tone mask, such as a half-tone mask, is selectable as a material of the planarizing film. That is, the organic EL display panel according to the above aspect of the present invention has a configuration that can be manufactured to have banks of two different heights, without the need to increase the manufacturing steps.

In addition, in the case where each recess has openings in both the upper and lower surfaces of the planarizing film, the cell-electrode layers may each be placed in a recess, as will be described below, to be in electrical contact with the wiring layer through the bottom opening of the recess. In the above configuration, each recess may be considered to additionally function as a contact hole. Since each contact hole is not required to be formed at a separate region from a recess, an area size of the individual light-emitting cells is ensured to be larger than otherwise it would be.

It is not necessary that the second banks are entirely lower than the first banks. In order to ensure an adequate level of flowability of ink, it is preferable that each second bank have a portion that is lower in height than the first banks and that the length of the lower-height portion be at least 50% or more, and more preferably 70% or more, of the distance between the pair of first banks.

In the case where each recess has an opening in both the upper and lower surfaces of the planarizing film, it means that no planarizing film is present at a location above the bottom opening. That is, such regions located above the bottom openings may be referred to as "regions of the planarizing film (which) have been removed".

According to another aspect of the present invention, the organic EL display panel having the above configuration may be further adapted that each recess formed in the planarizing film has a bottom at a lower height than bottoms of the pair of first banks.

According to the above aspect of the present invention, even in the case where the bottoms of the first banks are at a lower height than the flat surface portions of the planarizing film located below the respective light-emitting cells, it is still ensured that the second banks are lower in height than the first banks. As a result, the line-bank configuration is adapted to have substantially the same function as the pixel-bank configuration. That is, while allowing ink being dropped to flow between the first banks, the second banks function as cell defining layers.

It is preferable that the bottom of each recess in plan view includes a continuous region extending from the bottom edge of the lateral surface of one of the first banks in the pair to the bottom edge of the lateral surface of the other first bank, and that the height of the continuous region is lower than the bottom of each first bank in the pair. The "plan view" refers to a view looking down from above in the direction in which the planarizing film and other films etc., are layered. In addition, in the case where the hole injection transporting layer etc., is disposed below the first banks, the bottom of each recess needs to be at a lower height than the lowermost surface of the hole injection transporting layer etc. Further, in the case where each recess has one or more steps (i.e., stair portions), the bottom of the recess is considered to be the surface of the uppermost step.

According to another aspect of the present invention, the organic EL display panel having the above configuration may further include: a plurality of cell-electrode layers disposed, one for each light-emitting cell, between the planarizing film and a corresponding one of the light-emitting layers. Part of an edge portion of each cell-electrode layer may be located inside a corresponding one of the recesses formed in the planarizing film. Each second bank may cover the part of the edge portion of the cell-electrode layer located in a corresponding one of the recesses formed in the planarizing film.

According to the above aspect of the present invention, it is ensured that part an edge portion of each cell-electrode layer is covered by a second bank. By virtue of this configuration, electric field concentration at such a location is prevented and thus occurrence of uneven luminance is prevented. In the case where each cell-electrode layer is rectangular in plan view, part of an edge portion of such a cell-electrode layer is considered to be at least either of two sides that intersect first banks, out of the four sides of the rectangle. In other words, part of an edge portion of a cell-electrode layer is considered to be at least either of the two edges of the cell-electrode layer opposing in the direction in which the first banks extend.

Here, the uneven luminance mentioned above is described. To cause the organic light-emitting layers to emit light, voltage is applied to the cell-electrode layers. At the time of voltage application, electric field may concentrate at part of an edge portion of a cell-electrode layer, which results in a localized flow of electric current into the organic light-emitting layer. The localized flow of electric current into an organic light-emitting layer causes the luminance to be higher at a localized region, which results in uneven luminance. In view of the above risk, the organic EL display panel according to the above aspect of the present invention ensures that the edge portion(s) of each cell-electrode layer is partially covered by a second bank. As a result, the electric field concentration at part of such an edge portion is prevented, and thus the occurrence of uneven luminance mentioned above is prevented.

Further, since the second banks according to the above aspect of the present invention cover part of the edge portion(s) of each cell-electrode layer, electrical shorting between such part of an edge portion of a cell-electrode layer and a common electrode is prevented. Each common electrode (may also be referred to as an upper electrode) is disposed above an organic light-emitting layer and has an opposite polarity to the anode. Here, the electrical shorting mentioned above is described. Each cell-electrode layer has a certain thickness. In the case where part of the edge portion(s) of each cell-electrode layer is not covered by an insulating film, especially in the case where the light-emitting layers are thinner than the cell-electrode layers, the risk is increased that the light-emitting layers are formed to have one or more step heights each at a location corresponding to part of an edge portion of a cell-electrode layer and thus to be discontinuous. In some cases, part of an edge portion of a cell-electrode layer may be exposed and such an exported portion of a cell-electrode layer may contact directly or at a significantly low resistance with a common electrode, which will be formed after the light-emitting layers. As a result of the contact between part of an edge portion of a cell-electrode layer and a common electrode, the electrical shorting mentioned above occurs. In view of the above risk, the organic EL display panel according to the above aspect of the present invention ensures that an edge portion of each cell-electrode layer is partially covered by a second bank. As a result, the electrical shorting between part of the edge portion of a cell-electrode layer is prevented. Note that part of an edge portion of each cell-electrode layer may be covered by a first bank, rather than by a second bank, provided that such part is adjacent to the first bank.

With the above configuration, the following advantage is achieved. That is, since part of an edge portion of each cell-electrode layer is located inside a recess, the size of individual light-emitting cells is maximized. Suppose that part of an edge portion of each cell-electrode layer is located outside a recess, the size of each light-emitting cell is relatively smaller because the region not provided with a cell-electrode layer does not contribute to emission of light. That is, regions lying between the pair of first banks usable to form light-emitting cells are not effectively used. In contrast, the above aspect of the present invention ensures the effective use of regions usable to form light-emitting cells.

According to another aspect of the present invention, the organic EL display panel having the above configuration may be further adapted that none of the recesses formed in the planarizing film are located below the first banks.

According to the above aspect of the present invention, the pair of first banks is ensured to have uniform height in the direction in which the first banks extend. In an extreme example, suppose that each recess is formed below the pair of first banks to extend in the direction to traverse the pair of first banks. In such a case, portions of the first banks located above the recesses are lower in height than other portions and may be as low as the height of the second banks. It is because a bank material is deposited to conform the inner profile such recesses. As a result, in the process of forming organic light-emitting layers, there is a risk that ink containing an organic light-emitting material flows not only across the second banks but also across the first banks. In a line-bank scheme, usually, organic light-emitting materials of different colors are deposited to the respective rows of light-emitting cells partitioned by the first banks. Therefore, it is preferable that the ink does not flow across the first banks. In the organic EL display panel according to the above aspect of the present invention, the first banks are higher than the second banks. Therefore, it is ensured that ink does not flow across the first banks in the process of forming organic light-emitting layers.

According to another aspect of the present invention, the organic EL display panel having the above configuration may be further adapted that each recess in the planarizing film has edges at locations below the lateral surfaces the pair of first banks.

According to the above aspect of the present invention, the second banks are ensured to be entirely lower in height than the first banks, which improves the flowability of ink. Suppose, for example, that the edges of each recess do not extend to reach a location below the first banks, portions of the second banks connected to the first banks have the same height as the first banks. Naturally, such high-height portions of the second banks do not help to improve the flowability of ink. Note that in the above aspect of the present invention, it is preferable that no recess is located below the top surface of any first bank to more readily ensure that the top surface of each first bank is higher than the second banks.

According to another aspect of the present invention, the organic EL display panel having the above configuration may be further adapted that the pair of first banks is disposed to extend in lines.

According to the above aspect of the present invention, a plurality of light-emitting cells are continuously aligned, so that all the light-emitting cells of the display panel are readily arranged into a matrix. Note that the light-emitting cells are described above as being "continuously" aligned. Yet, each two adjacent light-emitting cells are partitioned by a second bank and not physically integral. In addition, a plurality of light-emitting cells in a row may be aligned linearly or in a zigzag.

According to another aspect of the present invention, the organic EL display panel having the above configuration may be further adapted that the light-emitting layers disposed in the light-emitting cells are made from a light-emitting material of a same color.

According to the above aspect of the present invention, a plurality of light-emitting cells aligned between the pair of first banks all have organic light-emitting layers of the same color. Thus, the organic light-emitting layers of the respective light-emitting cells aligned between the pair of first banks can be made by flowing ink containing an organic light-emitting material across the plurality of light-emitting cells, so that the organic light-emitting layers are ensured to be uniform in thickness.

According to another aspect of the present invention, the organic EL display panel having the above configuration may be further adapted that a lower portion of each recess constitutes a contact hole for connection between the cell-electrode layer and the wiring layer, and that a top portion of the recess overlaps in a vertical direction with a region where the contact hole is formed.

According to the above aspect of the present invention, the top opening of each recess is formed in a region of the planarizing film that overlaps, in a vertical direction, with a region of the planarizing film where the contact hole is homed. In other words, since each recess is formed to coincide with a region where a contact hole is formed, the presence of recesses does not uselessly reduce the area of each light-emitting cell.

As described above, each of said overlapping regions of the planarizing film includes in plan view the region where a contact hole is formed. That is, each recess opens into both the upper and lower surfaces of the planarizing film. Therefore, the cell-electrode layers may be disposed so that part of each cell-electrode layer is contact with the wiring layer. In this case, each recess may be considered to have a function of a contact hole and each contact hole may be considered to be an integral part of the recess. For example, each recess may have a boxed-shape portion at the top and a perforation portion of a relatively small diameter at the bottom.

Note that the state in which each cell-electrode layer is connected to the wiring layer refers the state in which each contact hole formed in the planarizing film opens into both the surfaces, one facing toward the cell-electrode layer and the other facing toward the wiring layer. Thus, the cell-electrode layer is received within the contact hole to make contact with the wiring layer.

According to another aspect of the present invention, the organic EL display panel having the above configuration may be further adapted that each recess is smaller continuously or stepwise from the top opening toward the bottom opening.

According to the above aspect of the present invention, each recess formed in the planarizing film may have such a shape that an upper portion thereof is suitable for ensuring the second bank to be lower in height than the first banks and a lower portion thereof is suitable for ensuring the function as a contact hole.

In the case where each recess according to the above aspect of the present invention is smaller continuously from the top opening toward the bottom opening, the recess passes through the planarizing film and without any step (a stair portion). Therefore, in the process of forming the planarizing film, the recesses and contact holes may be formed at the same time by using a mono-tone mask rather than a multi-tone mask. In addition, each recess also functions as a contact hole. Note that each recess is reduced into a smaller diameter (i.e., into a smaller area size) and the degree of reduction is inherently determined according to the light exposure process and the developing process.

According to another aspect of the present invention, the organic EL display panel having the above configuration may be further adapted that: regions of the planarizing film have been removed, so that at least part of each recess is completely through the planarizing film; each contact hole is disposed to coincide at least with one of the regions where the planarizing film has been removed; and each cell-electrode layer is in contact with the wiring layer via a corresponding one of the contact holes.

In the above aspect of the present invention, it is clarified that each cell-electrode layer is in contact with the pattern layer via a contact hole. Note that regions of the planarizing film which have been removed correspond, for example, to where holes passing through the planarizing film are formed. In addition, each recess may have such a shape that a step is present between the upper portion and the lower portion. Alternatively, the upper portion and the lower portion may be connected without a step.

According to another aspect of the present invention, the organic EL display panel having the above configuration may further include an insulating protection film disposed between an upper surface of the wiring layer and a lower surface of the planarizing film. Here, the insulating protection film may have openings formed at regions coinciding with the contact holes, and each opening formed in the insulating protection film may be smaller in area than each recess formed in the planarizing film.

According to the above aspect of the present invention, the area of each recess is larger than the area of each opening formed in the insulating protection film, so that the contact area between the cell electrode layer and the pattern layer is ensured. According to the above aspect of the present invention, it is preferable that in plan view the region where each opening is formed is completely included in the region where a recess is formed. The above aspect of the present invention may be further adapted that each cell-electrode layer is electrically connected with the paten layer via the bottom opening formed in the planarizing film and the opening formed in the insulating protection.

According to another aspect of the present invention, the organic EL display panel having the above configuration may be further adapted that that each recess has a top opening that is larger in planar area than a corresponding one of the contact holes, so that the region of the top opening overlaps with the entire region of the contact hole.

According to the above aspect of the present invention, the region where a recess is formed is set to be larger than the region were a contact hole is formed. By ensuring that the entire region where the contact hole is formed overlaps with the region where the recess is formed, the area of the light-emitting cell is maximized.

According to another aspect of the present invention, the organic EL display panel having the above configuration may be further adapted that: the pair of first banks comprises three pairs of first banks; each pair of first banks corresponds to a different one of red, green and blue colors; and the light-emitting layers, the recesses and the second banks are disposed between the respective pairs of first banks.

According to the above aspect of the present invention, color images can be displayed. Note that such color images may be of four or more colors, instead of being limited to three colors. For example, the organic EL display panel may include four pairs of first banks and each pair corresponds to a different one of red, green, blue and white colors.

According to another aspect of the present invention, the organic EL display panel having the above configuration may be further adapted that: each recess formed in the planarizing film is designated as a first recess; each second bank is concaved by conforming to the internal profile of a corresponding one of the first recesses, so that a second recess is formed in an upper surface of the second bank; in each second recess, a same organic light-emitting material as the organic light-emitting layers is deposited; and volumetric capacities of the individual first recesses and of the individual second recesses formed between one of the three pairs of first banks are different from volumetric capacities of the individual first recesses and of the individual second recesses formed between other pairs of first banks.

According to the above aspect of the present invention, when the line-bank scheme is employed, ink containing an organic light-emitting material is applied also on the second banks. More specifically, the organic light-emitting material not only accumulates to form the organic light-emitting layers but also accumulates on the second recesses. That is, the amount of the organic light-emitting material accumulated in each second recess during the manufacturing is adjusted, by changing the volumetric capacities of the individual first recesses and thus to change the volumetric capacities of the individual second recesses change. For example, by increasing the volumetric capacity of each second recess to increase the amount of organic light-emitting material to be accumulated therein, the thickness of organic light-emitting layers formed as a result of applying the same amount of ink decreases.

As mentioned above, different colors of ink is applied between the respective pairs of first banks. Here, if the recesses are formed to have different volumetric capacities depending on the corresponding colors, the thicknesses of the organic light-emitting layers formed by applying the same amount of ink are adjusted for the respective colors. Therefore, the above configuration is suitable in the case where an optimum thickness of one or more colors of the organic light-emitting layers is different from that of the other color(s). Note that both the amount of ink to be applied and the volumetric capacity of a recess may be made to differ depending on a corresponding color.

According to another aspect of the present invention, the organic EL display panel having the above configuration may be further adapted that: each recess formed in the planarizing film is designated as a first recess; each second bank is concaved by conforming to the internal profile of a corresponding one of the first recesses, so that a second recess is formed in an upper surface of the second bank; in each second recess, a same organic light-emitting material as the light-emitting layers is deposited; and areas of the individual first recesses and of the individual second recesses formed between one of the three pairs of first banks are different from areas of the individual first recesses and of the individual second recesses formed between other pairs of first banks.

According to the above aspect of the present invention, the amount of the organic light-emitting material accumulated in each second recess during the manufacturing is adjusted, by changing the volumetric capacities of the individual first recesses to thus change the volumetric capacities of the individual second recesses change. Therefore, the thicknesses of the organic light-emitting layers to be formed by applying the same amount of ink are adjusted suitably for the respective colors, by providing the first recesses of different area sizes depending on the corresponding colors. Consequently, the same effects and advantages as the aspects described earlier are achieved.

According to another aspect of the present invention, the organic EL display panel having the above configuration may be further adopted that: each recess is composed of an upper recess portion having a top opening that opens into the upper surface of the planarizing film and a lower recess portion having a bottom opening that opens into the lower surface of the planarizing film; the upper recess portion is continuously smaller from the top opening toward the bottom opening; the lower recess portion is continuously larger from the bottom opening toward the top opening; each recess has a step present between the upper recess portion and the lower recess portion; each cell-electrode layer is formed to extend from a corresponding one of the light-emitting cells to a corresponding one of the recesses and in electrical connection with the wiring layer via the bottom opening; a depth or area of the individual upper recess portions and of the individual second recesses formed between one of the three pairs of first banks are different from a depth or area of the individual upper recess portions and of the individual second recesses formed between other pairs of first banks; and the bottom openings formed in the planarizing film between each of the three pairs of first banks are all uniform in shape.

According to the above configuration of the present invention, by changing the depth or area of each recess formed between one of the pairs of first banks, the amount of organic light-emitting material accumulated in each second recess is adjusted. Therefore, the thicknesses of the organic light-emitting layers to be formed by applying the same amount of ink are adjusted suitably for the respective colors, by providing the first recesses of different area sizes depending on the corresponding colors.

According to another aspect of the present invention, the organic EL display panel having the above configuration may be further adapted that: each second bank has an inclined surface delimiting a lateral surface of a corresponding one of the organic light-emitting layers, the lateral surface being one of lateral surfaces opposing in a direction in which the three pairs of first banks extend; and the inclination angle of each inclined surface of the second banks lying between one of the three pairs of first banks is different from the inclination angle of each inclined surface of the second banks lying between other pairs of the first banks.

According to the above aspect of the present invention, in the process of forming the organic light-emitting layers, the ink containing the organic light-emitting material applied between the respective pairs of the first banks dries to form a suitable surface profile. This is achieved because the surface profile of ink differs depending on the angles of the inclined surfaces of the first banks, as will be described later. The optimum inclination angle differs depending on the properties (such as the surface tension, viscosity and the like) of ink. It is therefore preferable that the inclination angle differ depending a corresponding color. Further, by providing the inclined surfaces of different inclination angles, it is enabled to adjust the amount of organic light-emitting material flowing into the second recesses. Thus, the amount of organic light emitting material that accumulates in each second recess is adjusted. Note it is not necessary that the inclination angles corresponding to the three colors are all different.

According to another aspect of the present invention, the organic EL display panel having the above configuration may be further adapted that: each cell-electrode layer has a bend at a portion coinciding with a peripheral edge of a corresponding one of the recesses; and each second bank is formed in a region larger than a corresponding one of the recesses, so that the second banks cover the bends in the cell-electrode layers in the direction in which the first banks extend.

According to the above aspect of the present invention, each cell-electrode layer bends at the peripheral edge of a corresponding one of the recesses. That is, such a bend is in a shape where the electric fields tends to concentrate upon application of voltage. Yet, the bends of the cell-electrode layers are covered by the second banks, so that the electric field concentration at the bends is prevented and thus the localized flow of electric current into the organic light-emitting layers is also prevented. Further, according to the above aspect of the present invention, the second banks cover the bends of the cell-electrode layers, so that the electrical shorting between a cell-electrode layer (a bend in a cell-electrode layer) and a common electrode is prevented.

Further, according to another aspect of the present invention, the organic EL display panel may be further adapted that the wiring layer is a thin-film transistor layer. According to the above aspect of the present invention, the plurality of light-emitting cells are operated by an active matrix method.

Further, according to another aspect of the present invention, the organic EL display panel may be further adapted that each of the pixel-cell electrode layers is made of metal, semiconductor, or a combination of metal and semiconductor.

Further, according to another aspect of the present invention, an organic EL display device includes the organic EL display panel as defined in any one of claims 1-20. According to the above aspect of the present invention, the organic EL display device is provided with the organic EL display panel described above, so that the same effects and advantages as the aspects described earlier are achieved.

Further, according to another aspect of the present invention, a method for manufacturing an organic EL display panel includes: a first step of forming a planarizing film above a wiring layer, so that a flat surface of the planarizing film is located above the wiring layer; a second step of forming a pair of first banks above the planarizing film to delimit lateral surfaces of a plurality of light-emitting cells disposed in a row; and a third step of forming a plurality of light-emitting layers one in each of the light-emitting cells lying between the pair of first banks. The first step includes forming a plurality of recesses in the planarizing film, each recess formed in a boundary region between adjacent light-emitting cells to extend across the boundary region in a direction intersecting the pair of first banks. The second step includes forming, from a same material as the first banks, a plurality of second banks connected to the first banks, each second bank formed above one of the recesses in the planarizing film and to conform in shape to an inner profile of the recess, so that the second banks are lower in height than the first banks.

According to the above aspect of the present invention, in the case of forming banks according to a line-bank scheme, the first and second banks are duly formed at the same time, without the need to change the amount of exposure light. As a result, the bank material can be selected from a wider variety of options, which allows a more suitable bank material to be used. More specifically, when applied to a line-bank scheme, the method for manufacturing an organic EL display panel according to the above aspect of the present invention enables to form banks of two different heights through the same processing step(s), without much requirements to be satisfied by the bank material used.

Further, according to another aspect of the present invention, the method for manufacturing an organic EL display panel may be further adapted that the second step includes: applying, to the planarizing film, a bank material for forming the first and second banks; exposing the bank material to light via a mask pattern patterned to leave the first banks and the second banks; and each second bank becomes concaved into a corresponding one of the recesses in the planarizing film by conforming to the inner profile of the recess, so that the second banks are lower in height than the first banks.

In the above aspect of the present invention, the second step is more specifically defined. The bank material applied over the planarizing film has regions each of which is concaved by conforming to the inner profile of a recess. At such a region, the bank material is lower in height than other regions. By leaving the lower-height regions of the bank material located above the recesses through, for example, the light exposure process with the same amount of light, the second banks are formed to be lower in height than the first banks.

Further, according to another aspect of the present invention, the method for manufacturing an organic EL display panel may be further adapted that: in the second step, the mask pattern used to leave the second banks is patterned to leave each second bank to be larger in planar area than each recess.

According to the above aspect of the present invention, the planar area of each second bank (the area of the second bank in plan view) extends outside the planar area of a corresponding recess in the direction in which the first banks extend. By virtue of the above configuration, even if the thickness of the bank material applied to the planarizing film is smaller than the depth of each recess, the following is ensured. That is, portions of the second banks may ride upon the lateral surfaces of each recess to extend outside the planar area of the recess. Yet, such portions of the second banks are ensured not to cause any electric concentration in localized regions of the organic light-emitting layers at the time of light emission. Thus, such portions of the second banks serve to act as cell defining layers stably delimiting the light-emission regions.

Further, according to another aspect of the present invention, the method for manufacturing an organic EL display panel may be further adapted that: the first step includes exposing the planarizing film to light via a mask pattern patterned to form the recesses; and the mask pattern used to form the recesses in the planarizing film is a multi-tone mask pattern having a plurality of light-transmitting portions having different transmittances.

According to the above aspect of the present invention, with the use of a so-called multi-tone mask, recesses and contact holes are simultaneously formed in the planarizing film such that the flat surface portions and the recesses of the planarizing film are at different height. Since the contact holes are essential for connection between the cell-electrode layers and the TFT layer, forming the recesses at the same time with the contact holes requires no additional manufacturing process. Note that the multi-tone mask may be any of a gray-tone mask, a slit mask, a stacked-layer mask, and a half-tone mask. Note that each recess may be formed in a separate region from a contact hole or each contact hole may be formed within the region of a recess.

Further, according to another aspect of the present invention, the method for manufacturing an organic EL display panel may be further adapted that: in the first step, regions of the planarizing film where the recesses are to be formed are exposed to light via the multi-tone mask pattern, so that regions where contact holes are to be formed and surrounding regions are exposed to light at different intensities, whereby each recess is formed to have a step.

According to the above aspect of the present invention, the regions where contact hole are to be formed and the surrounding regions are exposed to different amounts of light, so that each recess is formed to have a step (i.e., stair portion). In the above configuration, the recesses each having a contact hole are formed without any additional manufacturing process. In one example, each recess formed with a step is composed of: an upper portion having a shape that is continuously shallow from one of the first banks in the pair to the other first bank; and a lower portion having a shape of a relatively small diameter hole that opens into the lower surface of the planarizing film.

Further, according to another aspect of the present invention, the method for manufacturing an organic EL display panel may be further adapted that: the second step includes exposing the bank material to light via a mask pattern patterned so that regions of the bank material where the first banks and the second banks are to be formed are exposed to light of uniform intensity.

According to the above aspect of the present invention, the first banks and the second banks of different heights are foamed at the same time with the use of a mono-tone mask, for example. Therefore, the bank material needs to satisfy less requirements.

Further, according to another aspect of the present invention, the method for manufacturing an organic EL display panel may further include: a fourth step of forming, before the second step, a plurality of cell-electrode layers above the planarizing film, each cell-electrode layer formed at a location coinciding with one of the light-emitting cells. In the fourth step, each cell-electrode layer is formed such that part of an edge portion thereof is located inside a corresponding one of the recesses. In the second step, each second bank is formed to cover the part of the edge portion of a corresponding one of the cell-electrode layers.

According to the above aspect of the present invention, part of an edge portion of each cell-electrode layer is located within a corresponding one of the recesses, so that the display panel having the maximum cell regions is obtained. Further, according to the above aspect of the present invention, part of an edge portion of each cell-electrode layer is covered by a corresponding one of the second banks, so that the thus obtained display panel is configured to prevent the electric field concentration at such edges and thus prevent localized flow of electric current into the organic light-emitting layers. Further, according to the above aspect of the present invention, the second banks cover the bends of the cell-electrode layers, so that the electrical shorting between a cell-electrode layer (a bend in a cell-electrode layer) and a common electrode is prevented.

Further, according to another aspect of the present invention, the method for manufacturing an organic EL display panel may be further adapted that: in the fourth step, each cell-electrode layer is formed to extend from a corresponding one of the light-emitting cells to reach inside a corresponding one of the recesses after a bend at a location coinciding with a peripheral edge of the recess; and in the second step, the mask pattern used to leave the second banks are patterned to leave each second bank to be larger in planar area than each recess, and the second banks are formed to cover the bends in the cell-electrode layers.

According to the above aspect of the present invention, the bends in the cell-electrode layers are ensured to be covered by the second banks. Therefore, the thus obtained display panel is configured to prevent electric concentration at such bends and thus to prevent flow of electric current into localized regions of the organic light-emitting layers at the time of light emission.

According to another aspect of the present invention, the organic EL display panel having the above configuration may be further adapted that: each of the first banks in the pair has (i) a top surface that is continuous in the direction in which the first banks extend and (ii) a lateral surface that is outwardly inclined toward the planarizing film so that the distance between the first banks is shorter toward the planarizing film; and each recess in plan view is continuous from the location below the bottom edge of the lateral surface of one of the first banks in the pair and the location below the bottom edge of the lateral surface of the other first banks; and regions of the planarizing film corresponding to where the recesses are formed are lower in height than the regions of the planarizing film located below the top surfaces of the first banks.

In the above aspect of the present invention, the configurations of the first banks and the recesses are more specifically defined. According to the above aspect of the present invention, regions of the planarizing film located below the first banks may be lower in height than the regions of the planarizing film where the light-emitting cells are to be formed (flat surface portions). Even so, the continuous regions of the planarizing film are lower in heath than the regions located below the first banks. This ensures that the second banks are lower in height than the first banks.

Note that each of the continuous regions of the planarizing film has a certain width in the direction in which the first banks extend. The width of the continuous regions of the planarizing film is determined to be sufficient to ensure that the second banks are lower in height than the first banks. For example, the width of each continuous region of the planarizing film may be determined to be equal to or larger than the height of each first bank or equal to or larger than half the distance between the pair of first banks. In order to further improve the flowability of ink, it is preferable that each of the continuous regions of the planarizing film is lower than the regions of the planarizing film located below the top surface of each first bank, by 20% or more of the height of the top surface of each first bank, or more preferably by 40% or more of the height of the top surface of each first bank. Note that in the vicinity of the first banks, it is not required that the continuous regions of the planarizing film are lower than the height of the top surface of each first bank by 20% or more of the height of the top surface of each first bank.

According to another aspect of the present invention, the organic EL display panel having the above configuration may be further adapted that: each recess has a top opening that opens into the upper surface of the planarizing film and a bottom opening that opens into the lower surface of the planarizing film; each cell-electrode layer is formed to extend from a corresponding one of the light-emitting cells to a corresponding one of the recesses and in electrical connection with the wiring layer via the bottom opening.

According to the above aspect of the present invention, each recess also functions as a contact hole. By virtue of the above configuration, it is not necessary to form a contact hole at a separate region in plan view from where a recess is formed. Consequently, the presence of recesses does not uselessly reduce the area of each light-emitting cell.

According to another aspect of the present invention, the organic EL display panel having the above configuration may be further adapted that: each recess is composed of (i) an upper recess portion having a top opening that opens into the upper surface of the planarizing film and (ii) a lower recess portion having a bottom opening that opens into the lower surface of the planarizing film; the upper recess portion is continuously smaller from the top opening toward the bottom opening; the lower recess portion is continuously larger from the bottom opening toward the top opening; and each recess has a step present between the upper recess portion and the lower recess portion.

According to the above aspect of the present invention, each recess formed in the planarizing film may have such a shape that the upper portion is suitable for ensuring the second bank to be lower in height than the first banks and the lower portion is suitable for ensuring the function as a contact hole.

According to another aspect of the present invention, the organic EL display panel having the above configuration may be further adapted that: each cell-electrode layer is in electrical connection with the wiring layer via the bottom opening.

According to the above aspect of the present invention, each recess also functions as a contact hole. By virtue of the above configuration, it is not necessary to form a contact hole at a separate region in plan view from where a recess is formed. Consequently, the presence of recesses does not uselessly reduce the area of each light-emitting cell.

Embodiments

The following describes one exemplary embodiment of the present invention with reference to the drawings.

Note that the following embodiment is simply an example to clearly illustrate a configuration of the present invention and the effects and advantages thereof. The present invention is in no way limited to the following embodiment except in its essential features.

1. Configuration of Display Panel 1

The following describes an overall configuration of an organic EL display panel 1 (hereinafter abbreviated as "display panel 1" according to the present embodiment, with reference to FIG. 1.

The display panel 1 includes an image display unit 10 and a drive control unit 20 connected to the image display unit 10. The display panel unit 10 is an organic EL display device that uses the phenomenon of electroluminescence occurring in organic material and is composed of an array of organic EL elements.

The drive control unit 20 is composed of a signal line driving circuit 21, a scan line driving circuit 23, and a control circuit 25. The signal line driving circuit 21 and the scan line driving circuit 23 each have a thin-film transistor layer (described later) connected to control wiring. The control wiring is for controlling a pixel circuit that is composed of the thin-film transistors of the thin-film transistor layers. The signal line driving circuit 21 and the scan line driving circuit 23 receive power from a power supply unit (see FIG. 21). Note that in an actual display device 1, the arrangement of the drive control unit 20 with respect to the display panel unit 10 is not limited to that described above.

2. Configuration of Image Display Unit 10

Figure 2:
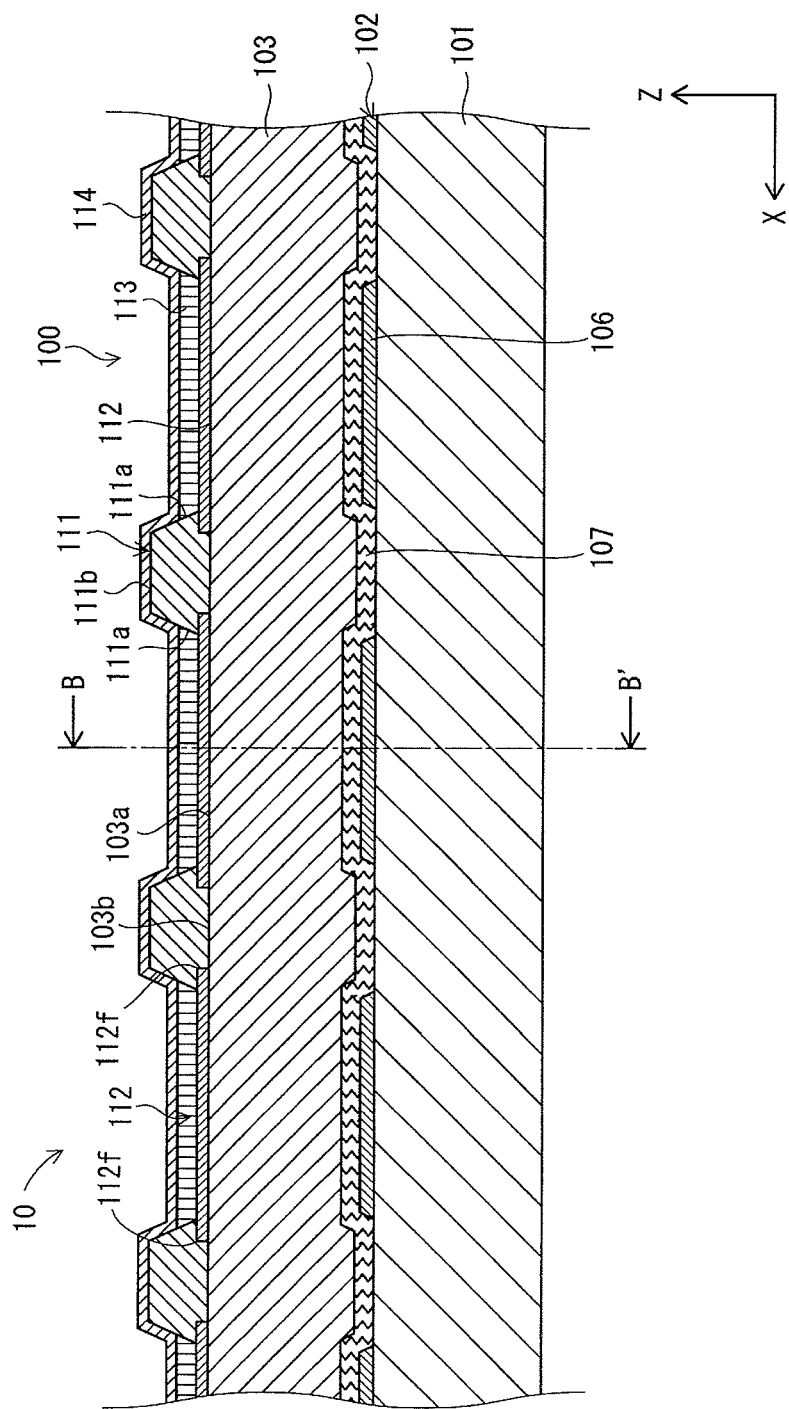
FIG. 2 shows a schematic cross-section of a light-emitting cell 100 in an image display unit 10, taken along line A-A'.
Figure 3:
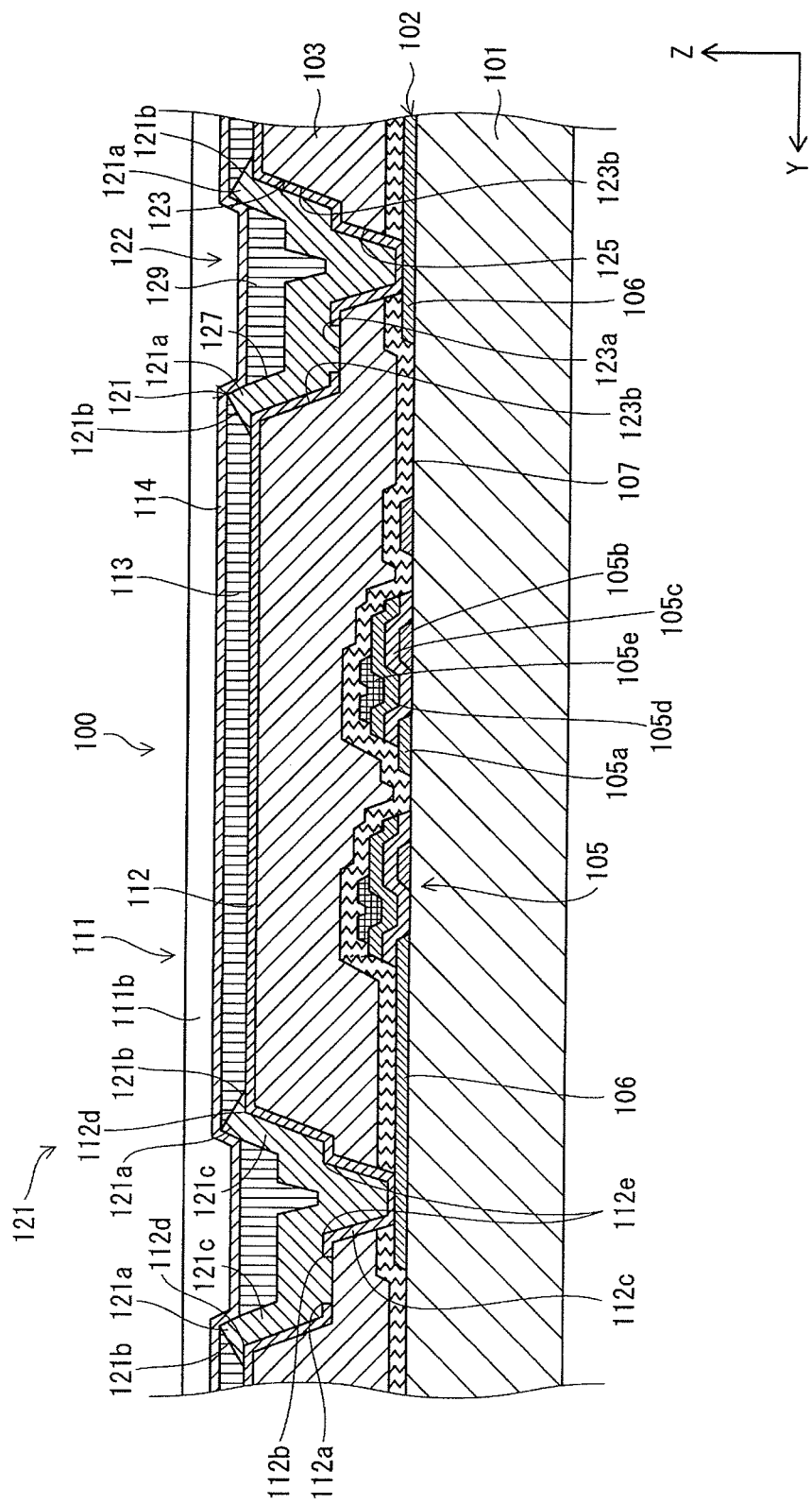
FIG. 3 shows a schematic cross-section of the light-emitting cell 100 in the image display unit 10, taken along line B-B'.

The following describes a configuration of the image display unit 10, with reference to FIGS. 2 and 3. According to the present embodiment, an organic EL display panel of a top-emission type is employed as an example of the image display unit 10. In addition, the image display unit 10 includes a matrix of light-emitting cells 100 each of which is provided with an organic light-emitting layer having a luminescent color of either red (R), green (G), or blue (B). FIG. 1 schematically shows part of the array light-emitting cells 100 on an enlarged scale within a "circle C".

FIG. 2 is a view schematically showing a cross section of some of the light-emitting cells 100, taken along the line A-A' of FIG. 1. FIG. 3 is a view schematically showing a cross section of one of the light-emitting cells 100, taken along the line B-B' of FIG. 2. In the following description, the Z axis direction of FIGS. 2 and 3 is an upward direction of the image display unit 10 and defines a location as being above.

The image display unit 10 includes a substrate 101, a thin-film transistor layer (TFT layer) 102 formed on the substrate 101, and a planarizing film 103 formed above the TFT layer 102.

The TFT layer 102 is composed of a plurality of thin-film transistors (TFTs) 105 and a wiring pattern formed on the substrate 101. A passivation film 107 serving as an insulating protection film is interposed between the TFT layer 102 and the planarizing film 103. Note that in the figures, the TFT layer 102 is depicted in a simplified manner, so that part of the configuration is omitted.

The TFTs 105 are activated by the signal line driving circuit 21 and the scan line driving circuit 23 to supply power to the respective light-emitting cells 100. As depicted in FIG. 3, each TFT 105 is composed of a source 105a, a drain 105b, a channel layer 105c, a gate insulating film 105d, and a gate electrode 105e stacked in the stated order. In the figure, in addition, the source 105a or the drain 105b of one of the TFTs 105 extends to form an SD electrode (source-drain electrode) 106 that is electrically connected to the light-emitting cell 100. The passivation film 107 is composed of an inorganic dielectric material such as silicon nitride (SiN) or silicon oxide (SiO) or an organic dielectric material such as acrylic- or polyimide-based material.

The planarizing film 103 is deposited on the TFT layer 102 having an uneven surface profile to form a flat surface 103a above the TFT layer 102. Note that it is sufficient that the upper surface of the planarizing film 103 is flat at least at regions where the light-emitting cells 100 are to be formed. It is not necessary that the entire surface of the planarizing film 103 is flat. As will be described later, the planarizing film 103 has contact holes and recesses are formed in the upper surface thereof.

In addition, the planarizing film 103 may be configured to have the same function as the passivation film 107. In that case, it is not necessary to provide the passivation film 107.

The present embodiment employs the line-bank scheme of partitioning the light-emitting cells 100, which are arranged in a matrix, into a striped pattern. Therefore, the image display unit 10 includes a plurality of first banks 111 (FIG. 2) disposed in parallel on the planarizing film 103 to partition the light-emitting cells 100 into a plurality of striped regions. Each first bank 111 extends substantially straight in the Y axis direction. It is preferable for each first bank 111 to have a substantially trapezoidal cross section, such that each first bank 111 has a pair of lateral surfaces 111a opposed in the X axis direction and inclined toward a substantially flat top surface 111b. Each of the two lateral surfaces 111a acts as a partition delimiting a lateral surface of the organic light-emitting layer 113 of a different one of the light-emitting cells 100. In FIG. 3, the lateral surface 111a of the first bank 111 present further away from the cross section is depicted in solid white on the topmost portion in the Z axis direction.

In addition, between each two adjacent first banks 111, anodes 112 are formed on the planarizing film 103, and organic light-emitting layers 113 are formed one on each anode 112. Note that the anodes 112 and the organic light-emitting layers 113 are discretely formed for each of the light-emitting cells 100. Further, at least in a light-emitting region, additional layer(s) such as a hole-injection layer (not depicted) or a hole-transporting layer (not depicted) may be provided between the anode 112 and the organic light-emitting layer 113. Further, additional layer(s) such as an electron-transporting layer (not depicted) or an electron-injection layer (not depicted) may be provided between the organic light-emitting layer 113 and the cathode 114, depending on the characteristics of the light emitter.

In addition, the cathodes 114 and a sealing layer (not depicted) are sequentially laminated on the first banks 111 and the organic light-emitting layers 113.

Further, the image display unit 10 has a plurality of second banks 121 (FIG. 3) each formed to extend transversely across a region between adjacent light-emitting cells 100 disposed in a row between a pair adjacent first banks 111. Each second bank 121 is connected to the pair of first banks 111. The second banks 121 define a boundary between each two light-emitting cells 100 adjacent in the direction in which the first banks 111 extend (in the Y axis direction). Note that the cross sectional profile of the second banks 121 significantly differs from that of the first banks 111. The cross sectional profile of the second banks 121 is such that as if a bank having a similar cross sectional profile to the first bank 111 is deformed by being collapsed into a recess formed in the planarizing film 103. Such a cross sectional profile of the second banks 121 results from the method of forming the second banks 121, which will be described later.

The first banks 111 and the second banks 121 (hereinafter, abbreviated as "banks 111 and 121") and the planarizing film 103 all have insulating properties.

In the present embodiment, each light-emitting cell 100 is composed of an anode 112, an organic light-emitting layer 113, and a cathode 114 stacked on the planarizing film 103 in the stated order. In plan view, the region (hereinafter, referred to as a "planar region") of each light-emitting cell 100 is delimited by the first banks 111 and the second banks 121.

Note that the planar region of each light-emitting cell 100 is mainly determined by the planar region of an organic light-emitting layer 113, and the planar region of each organic light-emitting layer 113 in the X axis direction is delimited by being sandwiched between a pair of first banks 111. That is, the lateral surfaces of each light-emitting cell 100 aligned between a pair of first banks 111 are delimited by the pair of first banks 111. More specifically, the lateral surfaces of each light-emitting cell 100 are defined by the opposing lateral surfaces 111a of a pair of first banks 111.

The following describes materials of important components of the image display unit 10.

a) Substrate 101

The substrate 101 is formed with a base of an insulating material such as alkalifree glass, soda glass, nonfluorescent glass, phosphate-based glass, borate-based glass, quartz, acrylic-based resin, styrenic-based resin, polycarbonate-based resin, epoxy-based resin, polyethylene, polyester, silicon-based resin, alumina, etc.

b) Planarizing Film 103

The planarizing film 103 is formed with a positive photosensitive resin material, such as polyimide-based resin, acrylic-based resin, Cyclotene-based resin or novolac-based resin. Alternatively, as the material of the planarizing film 103, a photosensitive resin material, such as acrylic, polyimide or siloxane resin material may be used. Alternatively, a negative photosensitive resin material may be used.

c) Anode 112

Each anode 112 is composed of a single layer or a laminate of a plurality of layers of metal material(s) such as Ag (silver), APC (alloy of silver, palladium, and copper), ARA (alloy of silver, rubidium, and gold), MoCr (alloy of molybdenum and chromium), and NiCr (alloy of nickel and chromium). Alternatively, each anode 112 may be formed with a semiconductor material such as ITO (Indium Tin Oxide), IZO ($In_2O_3$—ZnO), ZnO, InO or SnO. Note that a metal material refers to a material whose resistance increases as the temperature rises, and a semiconductor material refers to a material whose resistance decreases as the temperature rises. Note that in the case of a panel of a top-emission type as in the present embodiment, it is preferable that the anodes 102 be formed with highly reflective material.

d) Banks 111 and 121

The banks 111 and 121 are formed with an organic material such as resin and have positive photosensitivity and insulating properties. Examples of organic materials usable for the banks 111 and 121 include Cyclotene-based resins. It is also preferable that the banks 111 and 121 have organic solvent resistance. Alternatively, the banks 111 and 121 may be formed from a negative photosensitive material.

In addition, since the banks 111 and 121 are formed through the application process, the exposure and developing process, the baking process, and the like, it is also preferable that the banks are made from a material that exhibits desired functions after the processes mentioned above. For example, the desirable material has a good water repellency that repels ink in the ink application process or the tendency to yield a small amount of decomposition gas during the operation or storage of the panel.

Note that as the insulating material of the banks 111 and 121, any material including the above materials can be used and especially a material with a resistivity of $10^5$ Ω/cm or higher is preferable. Using a material with a resistivity of less than $10^5$ Ω/cm leads to production of leak current between the anodes 112 and the cathodes 114, or between adjacent light-emitting cells 100, which causes a variety of problems such as increased power consumption.

Further, in order to impart liquid repellency to the first banks 111, a water repellent material such as fluororesin may be used to form the first banks 111. Alternatively, the liquid repellency may be imparted through the plasma surface-treatment with a fluorine gas. The use of a hydrophilic material for forming the banks 111 incurs the following risk in manufacturing the image display unit 10. That is, the ink containing an organic light-emitting material may flow along the surfaces of the banks 111 into light-emitting cells 100 adjacent in the X axis direction, which leads to mixture of inks of different colors.

The structure of the banks 111 and 121 need not be a single layer as shown in FIG. 2. The banks 111 and 121 may be of a multi-layer structure composed of two or more layers. In such a case, the above materials may be combined for each layer, or non-organic and organic materials may be separately used for the respective layers.

e) Organic Light-Emitting Layer 113

The organic light-emitting layer 113 has a function of emitting light when an excitation state is produced by the recombination of holes injected through the anode 112 with electrons injected through the cathode 114. The material used to form the organic light-emitting layers 113 needs to be a luminescent organic material which can be formed into a film by a wet printing method.

Specifically, it is preferable that the organic light-emitting layers 113 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

f) Cathode 114

The cathodes 114 are formed, for example, of ITO, indium zinc oxide (IZO), etc. In the case of the display panel 10 of a top-emission type, it is preferable that the cathode 114 be formed with a light-transmitting material. It is preferable that the degree of transparency be 80% or greater.

In addition to the above materials, examples of the materials usable for the cathodes 114 include the following. That is, each cathode 114 may be composed of a layer containing an alkali metal, an alkali earth metal, or a halide of an alkali metal or alkali earth metal, laminated on a layer containing silver in the stated order. The layer containing silver may be formed with silver alone, or with a silver alloy. Also, in order to increase the efficiency of light extraction, a highly transparent refraction index adjustment layer may be provided above the layer containing silver.

g) Sealing Layer

The sealing layer has the function of controlling the organic light-emitting layer 113 or other layers from being exposed to moisture or air and is formed, for example, with silicon nitride (SiN), silicon oxynitride (SiON) etc. In the case of the top-emission type display panel 10, it is preferable that the sealing layer be formed with a transparent material.

3. Detailed Configurations of Banks 111 and 121, Anode 112 and Planarizing Film, etc.

Figure 4:
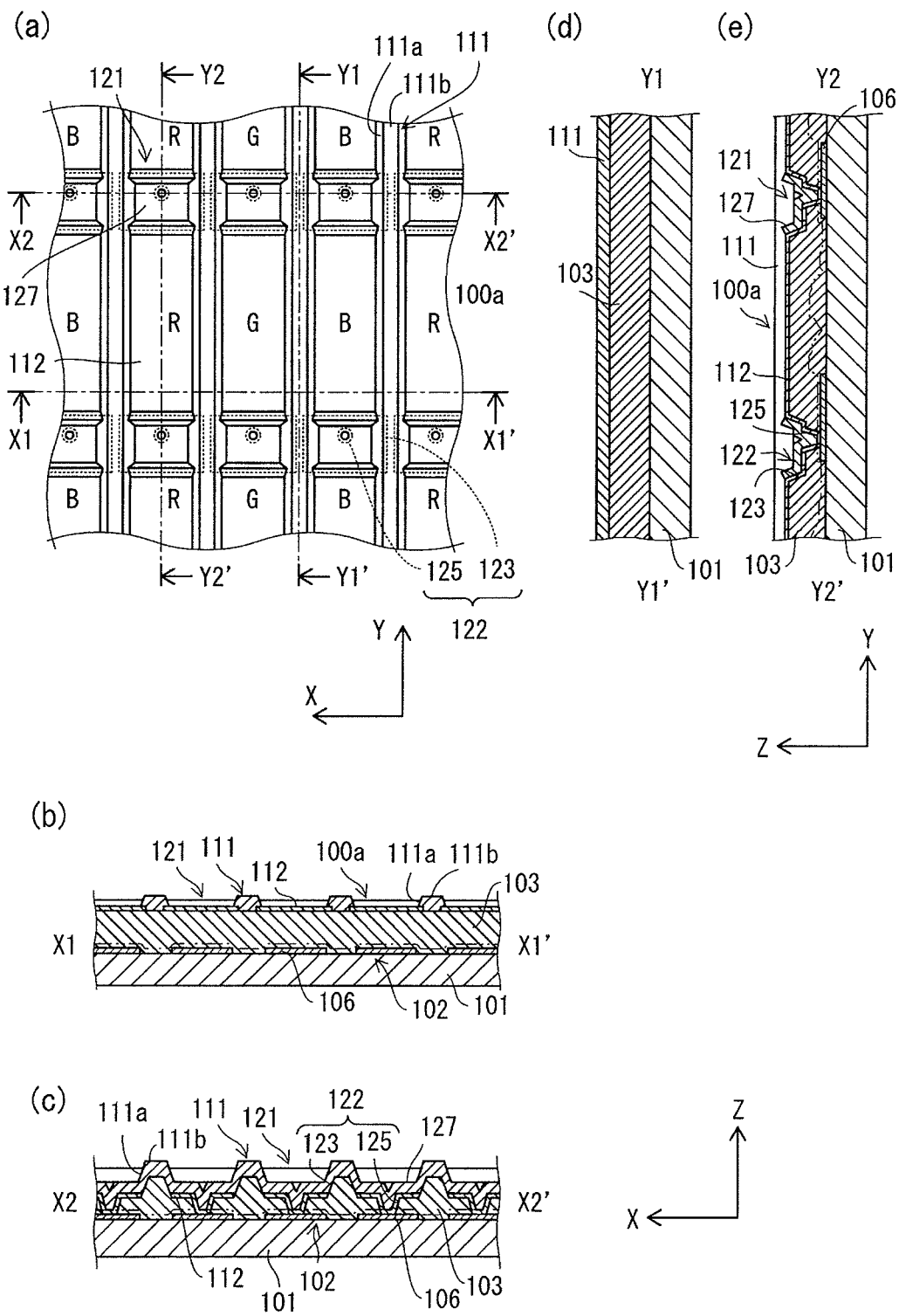
FIG. 4 shows a schematic plan view and schematic cross-sections illustrating configurations of banks 111 and 121 in the image display unit 10.

The following describes the first banks 111, the second banks 121, the planarizing film 103, etc., with reference to FIGS. 2-4. In FIG. 4, (a) is a schematic plan view of part of the image display unit 10 to show the first and second banks 111 and 121. In FIG. 4, (b) and (c) each schematically show a cross section taken along the line X-X', while (d) and (e) each schematically show a cross section taken along the line Y-Y'. Note that the organic light-emitting layers 113 and the cathodes 114 are not show in these figures.

As shown in FIG. 4(a), the first banks 111 and second banks 121 enclose the individual cell regions 100a in each of which a light-emitting cell 100 is formed. Each cell region 100a is of a rectangular shape with the longitudinal direction thereof coinciding with the Y axis direction. In FIGS. 4(b) and (c), portions of the second bank 121 present further away from the cross section are depicted in solid white on the topmost part of the figure in the Z axis direction.

As denoted by the reference sings R, G and B in the figure, each cell region 100a (and thus each light-emitting cell 100) is of a corresponding one of red (R), green (G), and blue (B) colors. In addition, the cell regions 100a aligned in a row in the Y axis direction are of the same color. On the other hand, in the X axis direction, the cell regions 100a are arranged so that the colors of R, G and B sequentially appear. In short, a plurality of cell regions 100a present between a pair of adjacent first banks 111 are all of the same color. On the other hand, any cell region 100a is of a different color from adjacent cell regions 100a delimited by a pair of first banks 111 in the X axis direction.

Figure 5:
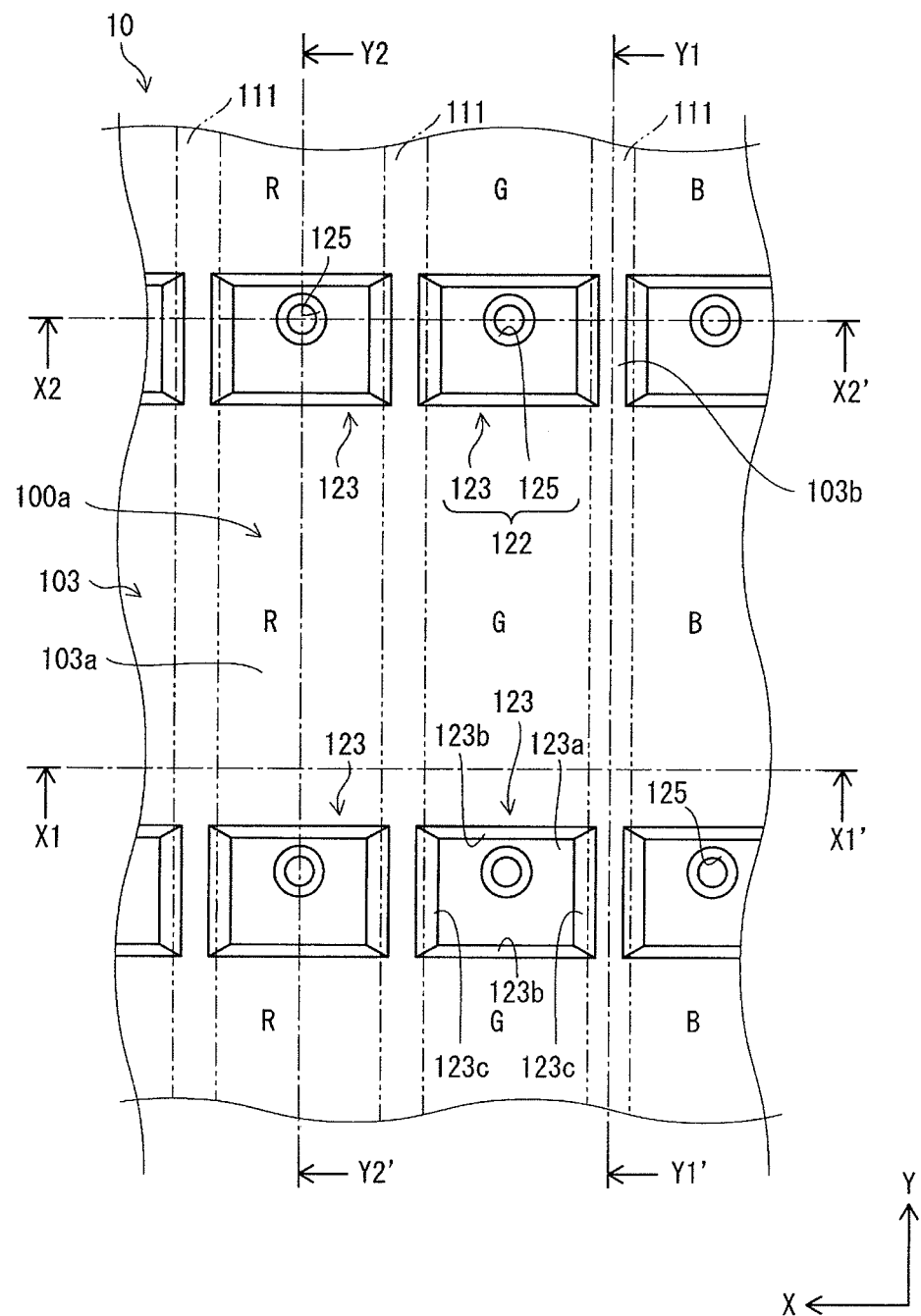
FIG. 5 shows a schematic plan view of recesses 123 formed in a planarizing film.

FIG. 5 shows the upper surface of the planarizing film 103. Most of the upper surface of the planarizing film 103 is occupied by a flat surface 103a, except where recesses 122 are formed each at a location below the second banks 121. Each recess 122 is composed of two portions one at the top and the other at the bottom. The top portion is a box-shaped portion 123 (upper recess portion) having a shape similar to a box. The bottom portion is a contact-hole portion 125 (lower recess portion) having a substantially cylindrical shape (see FIGS. 3 and 4). The interior shape of each box-shaped portion 123 defines a pyramidal frustum having rectangular top and bottom surfaces, whereas the interior shape of each contact-hole portion 125 defines a conical frustum. The box-shaped portion 123 and the contact-hole portion 125 are connected in communication with each other.

As shown in FIG. 5, each box-shaped portion 123 is formed between cell regions 100a adjacent in the Y axis direction to extend transversely across the a region between a pair of first banks 111 adjacent in the X axis direction. Further, each box-shaped portion 123 extends in the direction intersecting the first banks 111 to across the boundary regions between cell regions 100a adjacent in the direction in which the first banks 111 extend.

More specifically, each box-shaped portion 123 is present between a pair of adjacent first banks 111 so as to continually extend from the bottom edge of the lateral surface 111a of one of the first banks 111 to the bottom edge of the lateral surface 111a of the other one of the first banks 111. In the present embodiment, sides (edges) of each box-shaped portion 123 extending in the Y axis direction are located below the first banks 111.

Note, however, each box-shaped portion 123 does not extend to reach a region 103b that is located below the top surface 111b of any first bank 111, so that a region of the planarizing film 103 located below the top surface 111b is in flush with regions of the planarizing film 103 coinciding with the cell regions 100a. On the other hand, at each region of the planarizing film 103 where a box-shaped portion 123 is formed, the height of the planarizing film 103 is lower than a region of the planarizing film 103 located below a cell region 100a. Note that each regions 103b of the planarizing film 103 longitudinally extend along the top surfaces 111b of the first banks 111 and are uniform in height in the Y axis direction.

Each box-shaped portion 123 has a rectangular bottom surface 123a and has two pairs of opposing lateral surfaces 123b and 123c each of which is outwardly inclined in the upward direction, so that the box-shaped portion 123 is continuously larger from the bottom surface 123a in the upward direction. The edge portions 112a and 112b of different anodes 112 are located inside each box-shaped portion 123 (see FIG. 3).

Each contact-hole portion 125 is a through hole formed through the planarizing film 103 and formed in the bottom surface 123a of a corresponding one of the box-shaped portions 123. That is, each contact hole 125 has two openings one of which is located in the bottom surface 123a of the box-shaped portion 123 and the other of which is located to face the SD electrode 106 of the TFT 105. Into each contact-hole portion 125, an anode 112 extends to define a concave conforming to the profile of the contact-hole portion 125, and the extended portion of the anode 112 forms a contact plug 112c that is electrically connected to an SD electrode 106. The anodes 112 are provided one for each light-emitting cell 100, and the respective anodes 112 of adjacent light-emitting cells 100 are spaced apart by a predetermined distance to provide insulation. Note that each contact plug 112c has a disc-shaped bottom surface and this bottom surface constitutes a "contact portion".

As can be seen from the figures, in plan view, the region of the contact portion is smaller than the bottom surface 123a of the box-shaped portion 123. In other words, the area of an individual recess 122 in plan view is larger than the area of an individual contact-hole portion 125 in plan view. In addition, when seen from the Z axis direction, the entire region of the contact-hole portion 125 completely overlaps with the region of the box-shaped portion 123.

Note, in addition, that although each box-shaped portion 123 shown in the figures is rectangular in plan view, it may be circular or polygonal. Similarly, although each contact-hole portion 125 shown in the figures is circular in plan view, it may be rectangular or polygonal.

In the present embodiment, the bottom surface 123a of each box-shaped portion 123 is one example of the "step" mentioned above. In addition, the area of each recess 122 decreases thus defines a profile like a stair at the step, and decreases continuously along the lateral surfaces 123b and 123c of the box-shaped portion 123 and the contact-hole portion 125. Although each recess 122 shown in the figures has one step, it is applicable to form a plurality of steps. In addition, the peripheral edge of the contact-hole portion 125 at each step may be cornered in cross section as shown in FIG. 3. Alternatively, the peripheral edge may be rounded to define a curved line in cross section. In addition, the angle formed by the meeting of the lateral surfaces 123b and 123c of each box-shaped portion 123 may be sharp or rounded off instead.

In the present embodiment, in addition, each box-shaped portion 123 has a top opening that opens into the upper surface (the flat surface 103) of the planarizing film Further, each contact-hole portion 125 has a bottom opening that opens into the lower surface of (the surface facing the passivation film 107) of the planarizing film.

Still further, the contact-hole portions 125 according to the present embodiment passes through the planarizing film 103 and correspond to the "region of the planarizing film (which) have been removed" mentioned above.

As in the X2-X2' cross section shown in FIG. 4(c), the recesses 122 are spaced apart in the X axis direction at a predetermined distance. More specifically, none of the box-shaped portions 123 is formed at a location below the top surface 111b of any of the first banks 111. This arrangement is to ensure that the regions of the planarizing film 103 at locations below the top surfaces 111b of the respective first bank 111 are at the same height as the cell regions 100a. Consequently, with respect to the Y axis direction, the individual first banks 111 are substantially uniform in height of the top surfaces 111b. As described above, by not forming any recess in the regions of the planarizing film 103 below the top surface 111b of the first banks 111, the shape of the first banks 111 and the height of the top surfaces 111b are ensured to be in preferable configurations. In the above description, each box-shaped portion 123 is formed in a region of the planarizing film 103 below the lateral surface 111a of a first bank 111. This arrangement is to ensure that the height of each second bank 121 is entirely lower to improve the flowability of ink containing an organic light-emitting material, so that the ink being applied more easily flows across the cell regions 100a adjacent in the Y axis direction.

Each second bank 121 is formed above one of the recesses 122 and has a shape defined by conforming to the internal profile of the recess 122. More specifically, each second bank 121 has a shape conforming to the bottom surface 123a and four lateral surfaces 123b and 123c of each box-shaped portion 123 as shown in FIG. 5. Consequently, in the upper surface of the second bank 121, smaller recesses 127 each having a similar shape as that of the recess 122 is formed. In addition, depending on the manufacturing conditions and the like, in the upper surface of the second bank 121, a smaller recess may additionally be formed at a location above a contact-hole portion 125. For the convenience in the manufacturing process, each recess 127 is filled with organic light-emitting material 129 (see FIG. 3). Yet, the organic light-emitting material 129 is insulated by the second bank 121 and does not emit light.

Each second bank 121 has ridges 121a elevated above the flat surface 103a shown in FIG. 5. The ridges 121a of the second banks define boundaries between light-emitting cells 100 adjacent in the Y axis direction. More specifically, an inclined surface 121b of each ridge 121a facing toward the organic light-emitting layer 113 delimits one of lateral surfaces of the organic light-emitting layer 113 opposing in the Y axis direction. In view of this, it is clear that each box-shaped portion 123 is formed at a location corresponding to the boundary between adjacent light-emitting cells 100.

To be more precise, each ridge 121a is elevated above the upper surface of each anode 112. For the sake of simplicity, however, the above description is given in a simplified manner since the thickness of each anode 112 is as thin as about one-tenth of the height of each ridge 121a from the flat surface 103a.

Note in addition that each ridge 121a is lower in height than each first bank 111. With this configuration, when ink containing organic light-emitting material is dropped, the ink is allowed to flow in the direction in which the first banks extend. At the same time, by the presence of the first banks 111, the ink applied to cell regions 100a is duly prevented from flowing into adjacent cell regions 100a corresponding to a different color.

Further, the inclined surface 121b of each ridge 121a extends in the Y axis direction beyond the edge of a recess 122, so that the edge of the inclined surface 121b is located above the flat surface 103a of the planarizing film 103 (FIG. 3). In other words, in plan view, the area of a second bank 121 is slightly larger than the area of a recess 122. As a result, the bends 112d in the anodes 112 where the electric field tend to concentrate, as will be described later, are covered by the second banks 121. More specifically, each bend 112d is covered by the ridge 121a and the lateral surface 121c of a second bank 121. In the figures, each bend 112d is depicted as being rather square-cornered. Yet, the bend 112d may be curved at a relatively small curvature. In such a case, the second banks 121 are disposed to cover the small curvature portions of the anodes 112.

In addition, the second banks 121 also cover the edge portions 112a and 112b of the anodes 112. Further, the second banks 121 also cover the contact plugs 112c each of which is located below one of the second banks 121. As will be described later, the electric field tends to concentrate at the edge portions 112a and 112b of the anodes 112 and also at the peripheral edges of the contact plugs 112c.

In the present embodiment, opposing lateral surfaces of two adjacent first banks 111 constitute the "pair of first banks" described above. More superficially, suppose that each first bank 111 is divided into two portions by an imaginary plane that is in parallel with both the Y and X axes. Then, two portions of different first banks 111 define a pair of lateral surfaces 111a that face each other across an organic light-emitting layer 113. Thus the two portions of the first banks 111 constitute the "pair of first banks" described above. In addition, the second banks 121 constitute the "second banks" mentioned above.

4. Operation of Display Panel

To display images on the image display unit 10, the signal line driving circuit 21 and the scan line driving circuit 23 operate according to an active matrix method to apply voltage to predetermined light-emitting cells 100 via the TFTs 105. As a result, in each predetermined light-emitting cell 100, electric current passes across the anode 112 and the cathode 114 to cause the organic light-emitting layer 113 to emit light. In addition, since the organic light-emitting layers 113 of the respective light-emitting cells 100 contain different organic light-emitting materials depending on the corresponding colors (red, green, and blue), the respective light-emitting cells 100 emit light in one of the red, green and blue colors.

Since the line-bank scheme is employed, a plurality of organic light-emitting layers 113 aligned in the Y axis direction are ensured to be uniform in thickness and thus uniform in luminance and chromaticity. By virtue of the uniformity, the image display unit 10 is enabled to display good quality images.

As described above, the organic light-emitting material 129 accumulated in the recesses 127 formed in the second banks 121 is electrically insulated from the anode 112 by the second banks 121. Therefore, no current passes through the organic light-emitting material 129 and thus no light emission is caused.

The following now describes the functions of the second banks 121.

For purposes of comparison, the following first describes a phenomenon that would occur if the second banks 121 are not provided.

Figure 6:
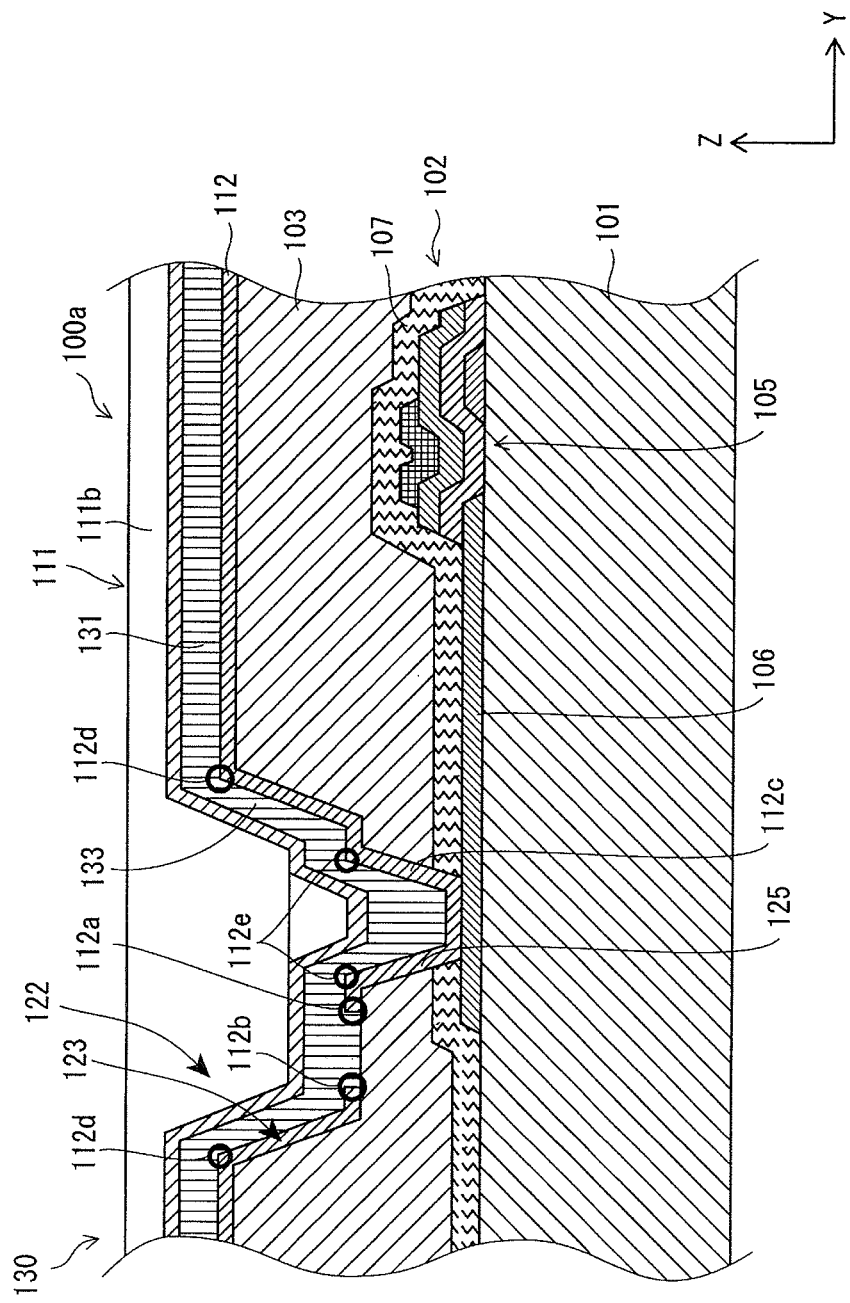
FIG. 6 shows a schematic cross-section of the image display unit 130 not having the second banks 121.

FIG. 6 schematically shows a cross section of the image display unit 130 without the second banks 121 (corresponding to FIG. 3). In FIG. 6, the lateral surface 111a of the first bank 111 present further away from the cross section is depicted in solid white on the topmost portion in the Z axis direction. Without the second banks 121, the following occurs in the manufacturing. That is, the organic light-emitting material 131 accumulates on part of the anodes 112 located in the respective cell regions 100a. In addition, the organic light-emitting material 133 accumulates directory on part of the anodes 112 located within the recesses 122. When voltage is applied to the anodes 112 to drive the image display unit manufactured in this way, electric current passes not only through the organic light-emitting material 131 but also through the organic light-emitting material 133 accumulated in each recess 122, so that both the organic light-emitting materials emit light.

It should be noted here that electric fields tend to concentrate at the edge portions 112a and 112b and the bend portions 112d of the anodes 112 and also at the peripheral edges 112e of the contact plugs 112c due to their angular shapes. Such electric field concentrations may result in unevenness in the luminance. More specifically, upon application of voltage to the anodes 112, the electric fields tend to concentrate locally at the edge portions 112a and 112b having a small radius of curvature, so that electric current may be caused to flow into local regions of the organic light-emitting material 133. As a result of such local flow of electric current, various problems are caused, including uneven luminance within the light emission surface and shortening of life-time due to local degradation.

Especially, the edge portions 112a and 112b of the anodes 112 need to be covered by the second banks 121 because electric fields tend to concentrate more easily at the edge portions 112a and 112b than at the bend portions 112e of the anodes 112 and the peripheral edges 112e of the contact plugs 112c. By the presence of the edge portions 112a and 112b, in addition, the regions on which organic light-emitting material accumulates are made to differ in height. Thus, the film of the organic light-emitting material 133 may be discontinuous at such an elevation change. Thus, the edge portion 112a or 112b of an anode 112 may contact a cathode 114 to cause electrical shorting.

In addition, it is difficult to regulate the film thickness of the organic light-emitting material 133 at regions around the bend portion 112d and the peripheral edge 112e. For this reason, similarly to the edge portion 112a or 112b, the bend portion 112d and the peripheral edge 112e of the anode 112 may contact an cathode 114 to cause electrical shorting.

As clarified above, it is highly important to coat the edge portions 112a and 112b, the bend portions 112d, and the peripheral edges 112e of the respective anodes 112.

In contrast to the above example described for comparison, the image display unit 10 according to the present embodiment is configured as shown in FIG. 3 such that the second banks 121 made of an insulating material coats portions of the anodes 112 where the electric field consecration and electrical shorting are likely to occur. With this configuration, the organic light-emitting material 129 is cut off from the flow of electric current, so that the occurrence of uneven luminance resulting from local flow of electric current and the occurrence of electrical shorting are prevented.

As described above, the second banks 121 cut off the path of electric current between regions of the light-emitting cells 100 adjacent in the Y axis direction where the occurrences of uneven luminance and electrical shorting are possible. In this way, the second banks 121 define the boundaries between the light-emitting cells 100 adjacent in the Y axis direction.

Note that the description given above with respect to uneven luminance and electrical shorting due to the electric field concentration still holds true, even if the recesses 122 are not formed. It is because regardless of whether the recesses 122 are present or not, the electric fields tend to concentrate due to the fact that the edge portions 112a and 112b of the anodes 112 and the peripheral edges 112e of the contact plugs 112c each have a small radius of curvature and thus the film thickness of the organic light-emitting layer 133 is not ensured to be uniform. Yet, the display panel 1 according to the present embodiment is provided with the recesses 122 and the edge portions 112a and 112b of the respective anodes 112 are located within the recesses 122. Due to this configuration, each anode has bend portions 112d. The concentration of electric fields at the bend portions 112d are the problem resulting from the provision of the box-shaped portions 123. Yet, by coating the bend portions 112d with the second banks 121, the occurrence of electric field concentration is prevented and thus electric current is prevented from locally flowing into a specific region.

In addition, the circumstances described above also apply to the peripheral edges 112f of each anode 112 opposing in the X axis direction. Thus, the peripheral edges 112f of the anodes 112 are coated by the first banks 111 made of an insulating material. In addition, since the first banks 111 coats the peripheral edges 112f of the anodes 112, it is also prevented that leakage current flows between an anode 112 and a cathode 114 via the interface between an organic light-emitting layer 113 and a first bank 111.

In the present embodiment, at lease one of the edge portion 112a and 112b of each anode 112 constitutes the "part of the edge portion of the cell-electrode layer" described above.

5. Manufacturing Method

The following describes a method for manufacturing the display panel 1 having the above-described configuration.

FIGS. 7-10 each schematically show cross sections of the image display unit 10 at respective manufacturing steps. In the figures, an X1-X1' cross section and an X2-X2' cross section at the same manufacturing step are placed side by side. Further, FIGS. 11 and 12 each schematically show Y2-Y2' cross sections of the display panel 1 at respective manufacturing steps.

In FIGS. 7-10, each X1-X1' cross section is labeled with an alphabetic letter followed by a numeral "1" in parentheses, such as (a1), whereas each X2-X2' cross section is labeled with an alphabetic letter followed by a numeral "2" in parentheses, such as (a2). In the following description, the labels (a1) and (a2), for example, may be abbreviated simply as (a). In FIGS. 7-12, the substrate 101 is omitted, and the TFT layer 102 is also omitted except for the SD electrode 106. Further, any Y1-Y1' cross section is not depicted since such a cross section is readily understandable from other figures and the description of the present embodiment. In some of the figures mentioned above, the lateral surface of a bank 111 or 121 and the lateral surface of a recess 122 present further away from the cross section is depicted in solid white. This is to clearly show the difference in height between the first bank 111 and the second bank 121.

(1) Process of Forming Planarizing Film

Figure 7:
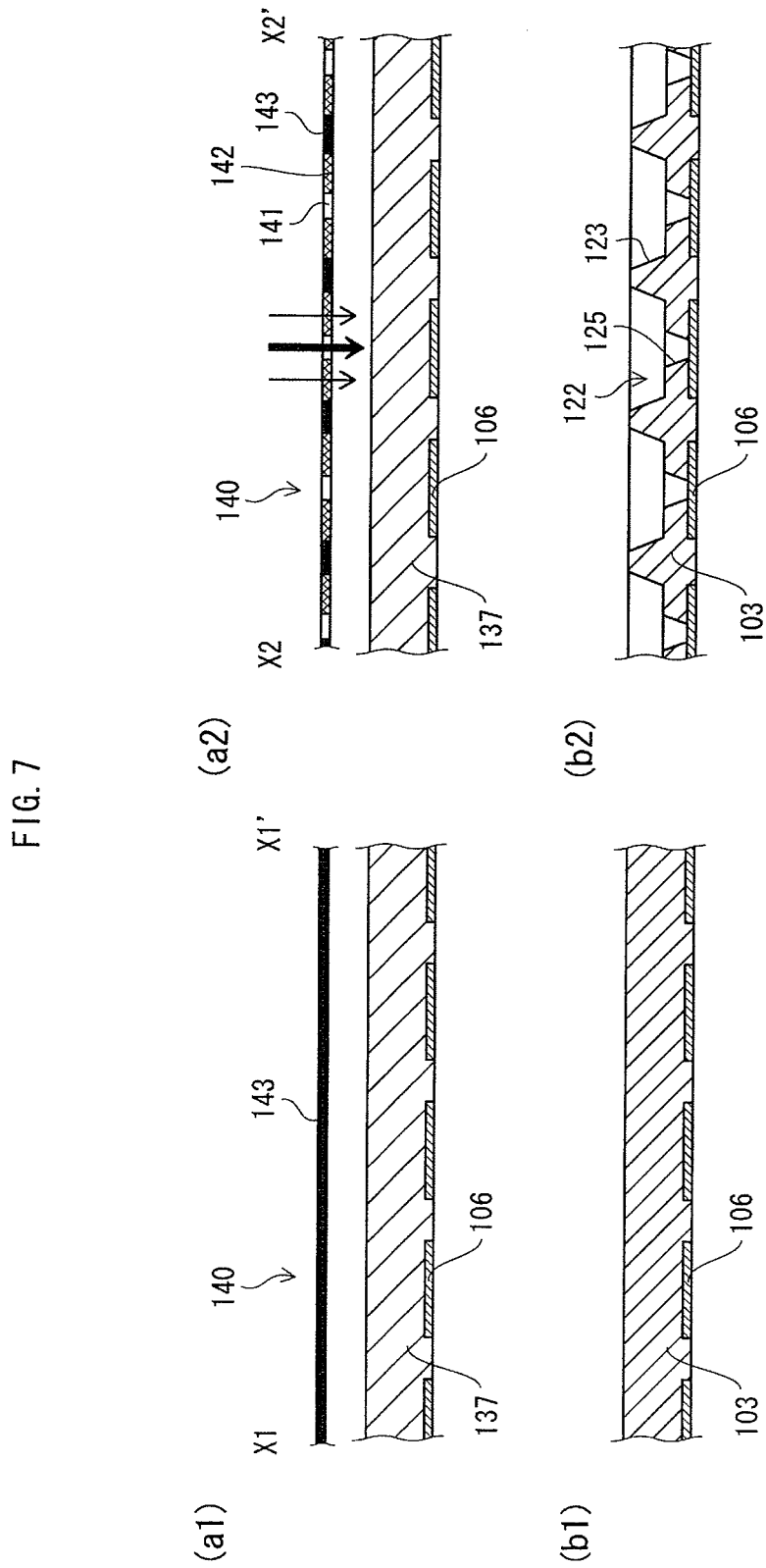
FIG. 7 shows schematic cross-sections illustrating steps of a planarizing film forming process in a manufacturing method of the image display unit 10.

As shown in cross sections labeled with (a)s and (b)s in FIG. 7, a resist film 137 of a positive photosensitive material is applied on the TFT layer 102 and exposed to light with the use of a multi-tone mask 140. In the developing process that follows, portions irradiated with light (exposed portions) are removed, so that recesses 123 and contact-hole portions 125 are formed. Then, a firing process (baking process) is performed.

The resist film 137 is applied by a casting method such as a spin coat method to fill the projections and depressions on the TFT layer 102 to form a flat surface above the TFT layer 102. Note that the resist film 137 may be applied by any other casting method, such as a slit coating method, a spray coating method, a roll coating method, a die coating method, or a dip coating method.

The multi-tone mask 140 used in the exposure process has transmission portions 141 each allowing light to pass through, semi-transmission portions 142 each reducing the amount of light to be transmitted, and shielding portions 143 each shielding light. Each semi-transmission portion 142 may have much finer patterns than the resolution of exposure machines and the number of fine patterns per unit area is adjusted to provide a desired light transmittance. Alternatively, each semi-transmission portion 142 may be a laminate of plurality of layers each of which has an appropriate light transmittance to adjust the overall light transmittance to a desired level. With the use of the semi-transmission portions 142, intermediate exposure is realized. Especially, to form the recesses 123 with a different depth for each colors of RGB, it is preferable that the multi-tone mask 140 has much finer patterns than the resolution of exposure machines and the number of fine patterns per unit area is adjusted to provide a desired light transmittance.

Note that the X1-X1' cross section corresponds to a cell region 100a where no recess 122 is to be formed and thus shielded by the shielding portions 143. As a result, the flat surface 103a remains unetched as shown in FIG. 7(b1). On the other hand, as is readily apparent by comparing the X2-X2' cross sections shown in FIGS. 7(a2) and (b2) with the Y2-Y2' cross sections shown in FIGS. 11(a) and (b), each transmission portion 141 is placed at a location corresponding to the region where a contact-hole portion 125 is to be formed and each semi-transmission portion 142 is placed at a location corresponding to the region where a box-shaped portion 123 is to be formed (i.e., the region excluding where the contact-hole portion 125 is to be formed). Note that in the present embodiment, the region where a contact-hole portion 125 is to be formed overlaps the region where a box-shaped portion 123 is to be formed. Thus, each semi-transmission portion 142 is placed to cover, excluding the region where a contact-hole portion 125 is to be formed, a region where a box-shaped portion 123 is to be formed.

In the developing process, the portions exposed to intensive light passing through the transmission portions 141 are removed so that holes completely passing through the planarizing film 103, i.e., the contact-hole portions 125 are formed. In addition, the portions exposed to less intensive light passing through the semi-transmission portions 142 (excluding the regions where contact-hole portions 125 are to be formed) are removed to form recesses in the upper surface of the planarizing film 103. As a result, the box-shaped portions 123 are formed. Note that the passivation film 107 (see FIG. 3) is subjected to a lithography process (which involves exposure, developing and etching) prior to application of the resist film 137, so that passivation film 107 at this stage already has openings each in communication with a contact-hole portion 125. Alternatively, no passivation film 107 is formed.

Through the firing process, for example, residues, such as solvent remaining on the resist film 137 are removed, so that the shape is stabilized and the adhesion with the TFT layer 102 improves.

Here, a brief description of the relation between the exposure process and the shape of the recessses 122 is given. The box-shaped portion 123 and the contact-hole portion 125 each has a shape that outwardly expands along the upward direction. This shape is designed in view of that light passes through the transmission portions 141 and the semi-transmission portions 142 diverges due to diffraction.

More specific description is given below. For example, light that travels in a straight line through the transmission portions 141 is relatively intense and thus reaches the deepest portion of the resist film 137. On the other hand, diffracted light is relatively weak and thus reaches as far as some midpoint in the resist film 137 or the surface of the resist film 137. The diffracted light is weaker as the deviation angle from the straight path is larger. As a result, the resist film 137 will have an opening that opens into the lower surface thereof at a region located below the transmission portion 141. The region of the resist film 137 surrounding the opening continuously increases in thickness so as to define an inclined surface.

The description given above also applies to the box-shaped portions 123.

Note that each opening formed in the passivation film 107, which acts as an insulating protection film, may be considered to be part of a contact hole. In that case, each recess 122 is then considered to have the function of a contact hole other than the opening.

(2) Process of Forming Anodes

Figure 8:
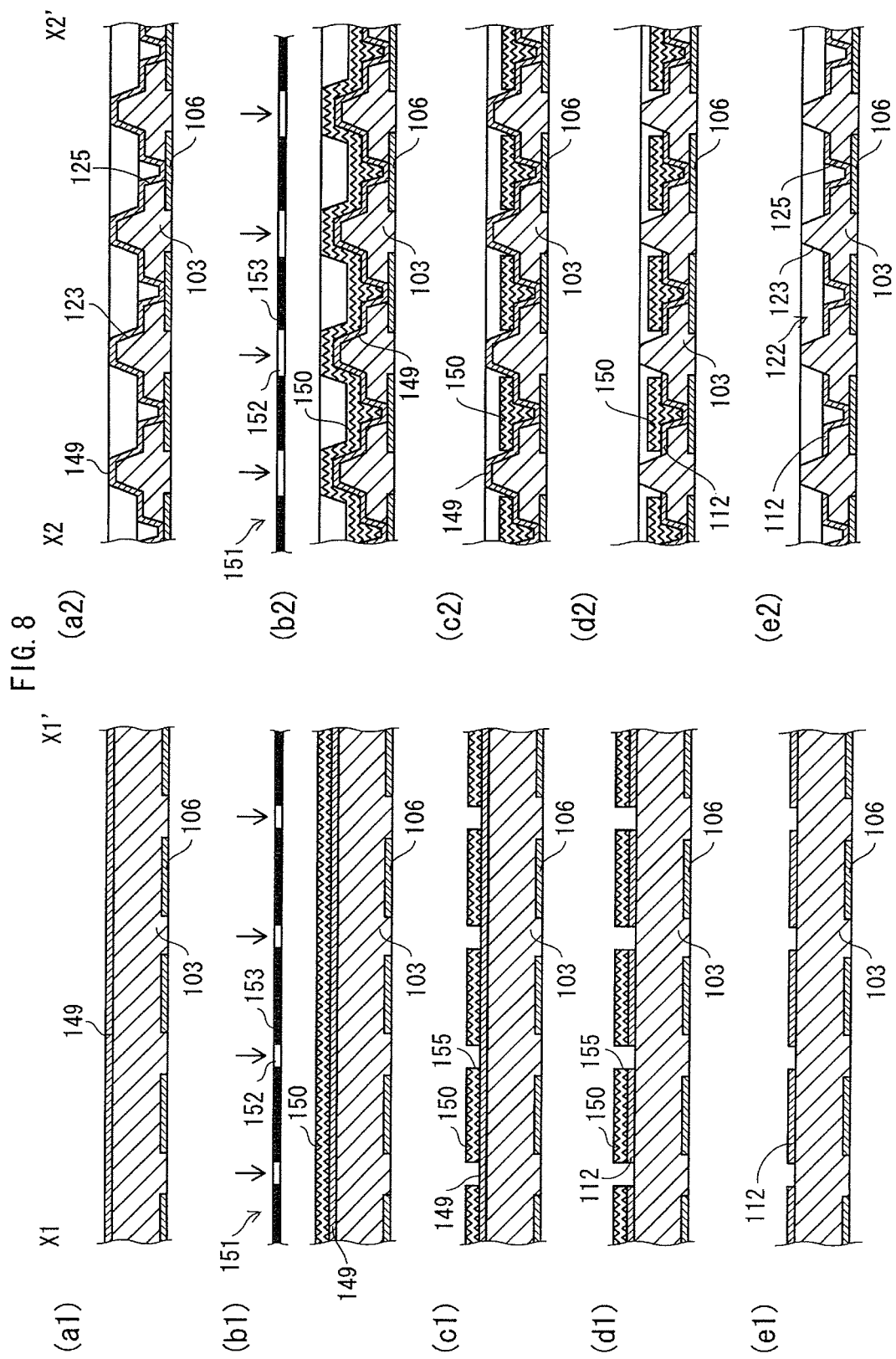
FIG. 8 shows schematic cross-sections illustrating steps of the planarizing film forming process in the manufacturing method of the image display unit 10.
Figure 9:
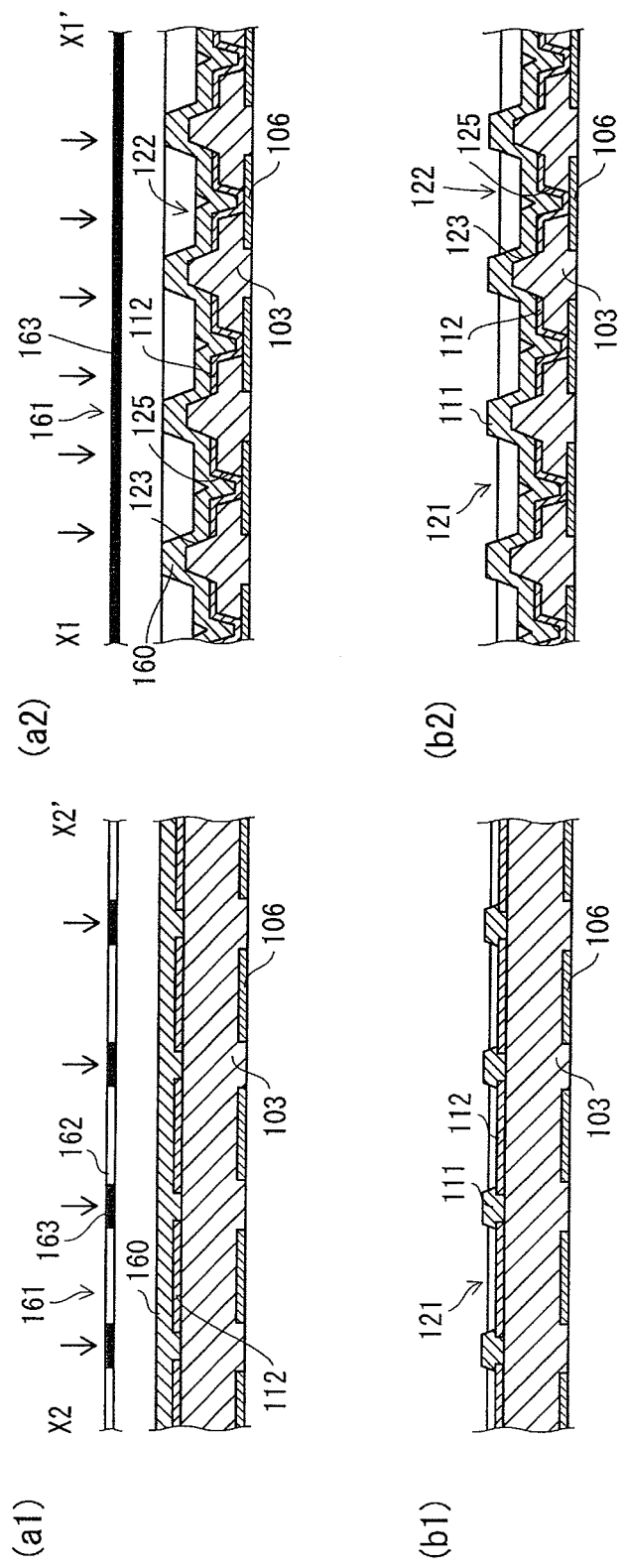
FIG. 9 shows schematic cross-sections illustrating steps of a bank forming process in the manufacturing method of the image display unit 10.
Figure 11:
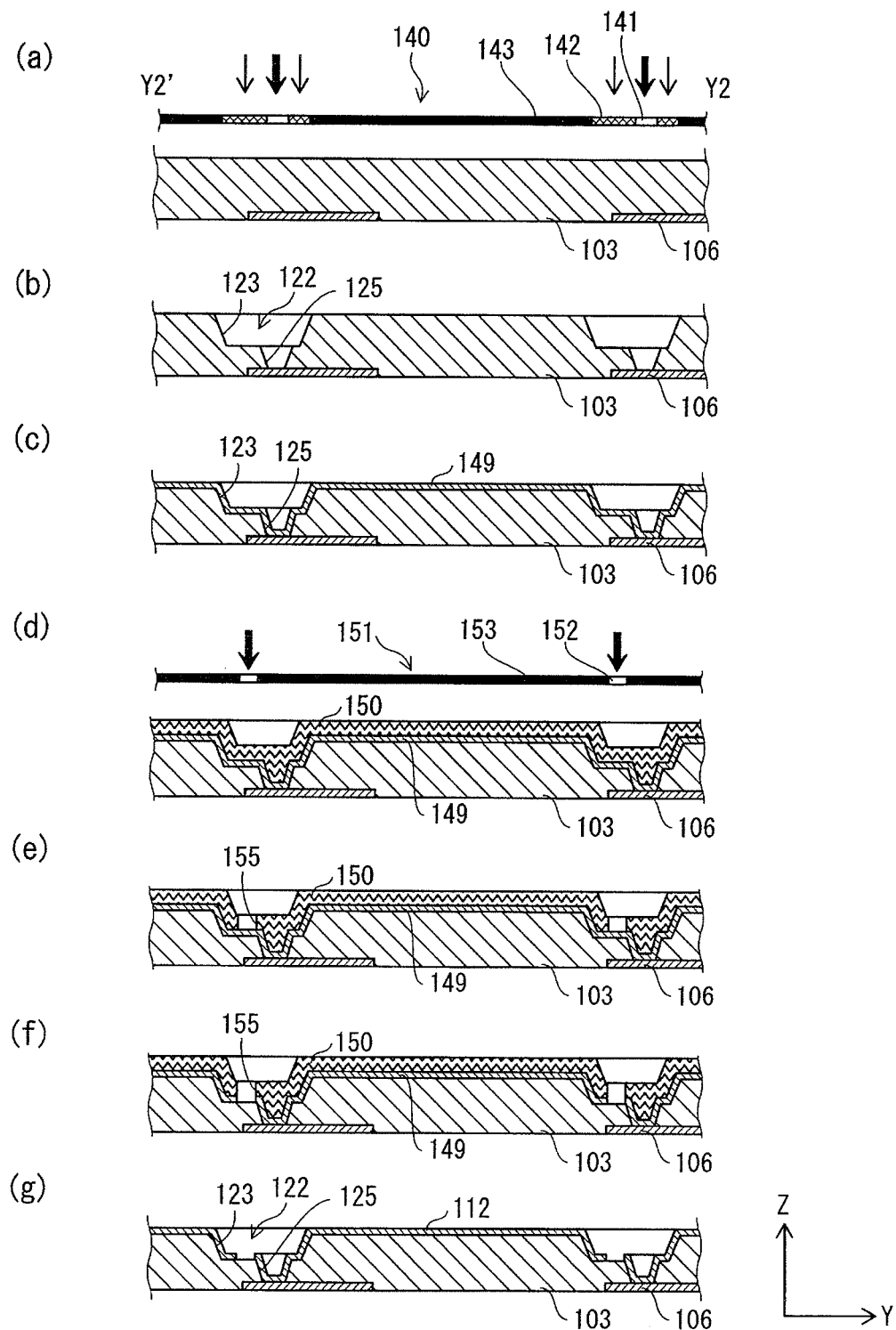
FIG. 11 shows schematic cross-sections illustrating steps of a planarizing film forming process and an anode forming process in the manufacturing method of the image display unit 10.
Figure 12:
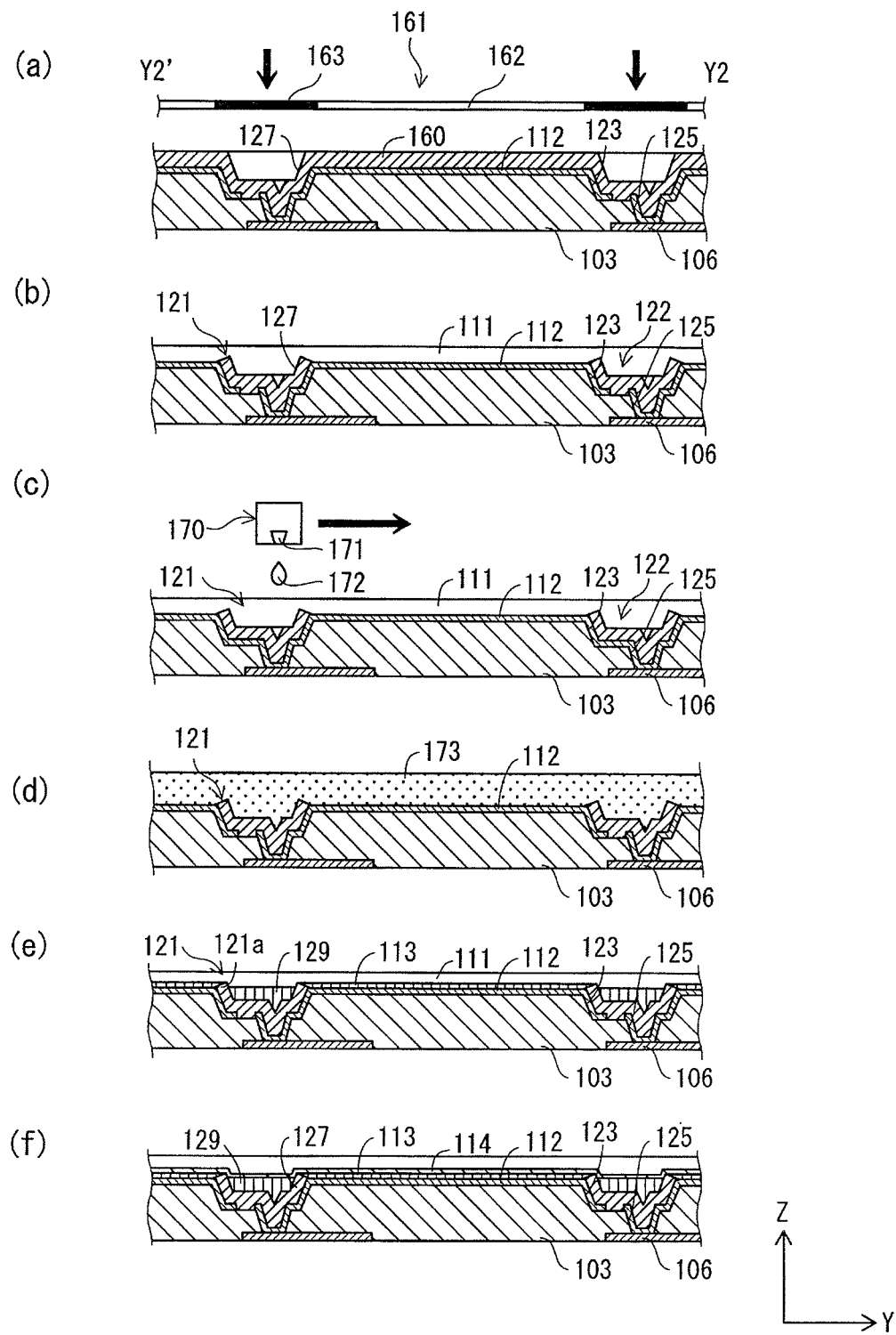
FIG. 12 shows schematic cross-sections illustrating steps of the bank forming process and the organic light-emitting layer forming process in the manufacturing method of the image display unit 10.

FIG. 8 shows cross sections (a)-(e) and FIG. 11 shows cross sections (c)-(g) each at a step of the process of forming the anodes 112.

First, a thin-film 149 such as an Ag or ITO film is formed on the planarizing film 103 by using a method such as sputtering or vacuum deposition (FIG. 8(a) and FIG. 11(c)).

Then, a positive resist 150 is applied on the thin-film 149, followed by light exposure via a mono-tone mask 151 (FIG. 8(b) and FIG. 11(d)). The mono-tone mask 151 has transmission portions 152 each of which allows transmission of light and shielding portions 153 each of which blocks transmission of light. With the use of the mono-tone mask 151, the portions of the resist 150 exposed to light defines a lattice pattern.

Thereafter, by developing and firing processes, the resist 150 is formed into a predetermined pattern (FIG. 8(c) and FIG. 11(e)). At this stage of manufacturing, the resist 150 in plan view is partitioned into a plurality of rectangular regions arranged in a matrix, by grooves 155 defining a lattice pattern.

In the subsequent step, a dry-etching (or wet-etching) is conducted to remove the lattice-pattern portions of the thin-film 149 which are not covered by the resist 150, so that the anodes 112 each having a rectangular shape in plan view are formed (FIG. 8(d) and FIG. 11(f). In the subsequent step, the resist 150 is removed (FIG. 8(e) and FIG. 11(g)).

(3) Process of Forming Banks

The following describes the process of forming banks on the planarizing film 103 and the anodes 112.

First, a bank material composed of a positive photosensitive resin material is applied to the planarizing film 103 having the anodes 112 formed thereon, followed by light exposure with the use of the mono-tone mask 161 (FIG. 9(a) and FIG. 12(a)).

In the step of applying the bank material, a method such as spin coat method is used, so that the bank material is deposited to form a bank material layer 160 having a generally uniform thickness. That is, the bank material layer 160 has substantially the same thickness at locations in the cell regions 100a as well as in the recesses 123. Consequently, the upper surface of the bank material layer 160 defines a profile generally conforming to the upper surface of the planarizing film 103. Yet, the thickness of the bank material layer 160 may vary to some extent at regions corresponding to where projections or depressions, such as recesses 122, are present. The bank material may be applied by any of various methods including a spray coating method, a roll coating method, a die coating method, a dip coating method and a slit coating method.

The mono-tone mask 161 has transmission portions 162 each allowing light to pass through and shielding portions 163 each blocking light. According to the present embodiment, the bank material layer 160 is made of a positive photosensitive material. Thus, the regions of the bank material layer 160 corresponding to where the first banks 111 and the second banks 121 are to be formed are shielded, whereas the regions of the bank material layer 160 not corresponding to where the first banks 111 and second banks 121 are to be formed are exposed to light.

In the subsequent step, portions of the bank material layer 160 residing on the cell regions 100a are removed through a developing process, and the remaining portions of the bank material layer 160 is sintered through a firing process (FIG. 9(b) and FIG. 12(b)). In this way, the first banks 111 and the second banks 121 are formed at the same time.

The following describes the light exposure process and the firing process conducted on the second banks 121, with reference to the schematic cross sections (a) and (b) shown in FIG. 13. The cross sections (a) and (b) shown in FIG. 13 correspond to the cross sections (a) and (b) shown in FIG. 12, respectively.

As shown in FIG. 13(a), each shielding portion 163 has an area that is slightly larger than an area of an box-shaped portion 123. This is to form each second bank 121 to be slightly larger in area than a box-shaped portion 123 so as to coat the bend portions 112d with the second bank 121.

Note that the above description of the relation between the exposure process depicted in (a2) and (b2) of FIG. 7 and the shape of the recessses 122 also applies here. That is, since the light passes through each transmission portion 162 diverges due to diffraction (arrows P and Q shown FIG. 13(a)), so that regions of the bank material layer 160 located below the shielding portions 162 are exposed to light of low intensity. By ensuring that the upper edge 160b of the lateral surface 160a of each concave in the bank material layer 160 is exposed to diffraction light, it is more reliably ensured that the second banks 121 are formed to be lower in height than the first banks 111.

By the developing process that follows the light exposure, an unfired body 166 of each second bank 121 is obtained as shown in FIG. 13(b). Through the firing process that follows, each unfired body 166 is deformed so that the inclination angle formed between the inclined surface 166a and the cell region 100a becomes smaller (as depicted by the straight line R). As a result, the second banks 121 are formed. In the firing process, the surfaces of the unfired body 166 melt to be tightly adhered to the anode 112 to define a forward-tapered profile. Through the firing process, in addition, the portion of the unfired body 166 (or the second bank 121) may slightly flow toward the adjacent cell regions 100a (outwardly of the box-shaped portion 123), so that the unfired body 166 (or the second bank 121) is widen in the Y axis direction.

Through the light exposure and developing processes described above, the second banks 121 are formed each at a location above a recess 122, so that the second banks 121 are lower in height than the first banks 111. Similarly, each second bank 121 is lager in area than a box-shaped portion 123, so that the second bank 121 is ensured to coat the bend portions 112d of the anodes 112. At the time of the light exposure process, as long as the straight lines P and Q are positioned lower than the peripheral edge 160b of each concave formed in the bank material layer 160, it is almost always ensured that the height of the second banks 121 are formed to be lower than the first banks 111. With the second banks 121 formed to be lower in height than the first banks 111, it is ensured that ink containing organic light-emitting material flows across the second banks 121 in a printing process, which will be described later.

Note that if the first banks 111 are not uniform in height, it is still sufficient that the height of the second banks 121 is lower than the minimum height of the first banks 111. In order to ensure that ink 173 to more smoothly flow upon being dropped, the preferable height of the second banks 121 is equal to 80% or less of the height of the first banks 111. The heights of the banks 111 and 121 each refer to the height from the flat surface 103a of the planarizing film 103. In the present embodiment, the height of the second banks 121 is set to fall within a range of 30% to 60% both inclusive of the height of the first banks 111.

The banks 111 and 121 are formed so that at least part of the surfaces thereof is made liquid repellent in order to prevent the ink for forming the organic light-emitting layers 113 from flowing into adjacent light-emitting cells 100.

(4) Process of Forming Organic Light-Emitting Layers

The following now describes the process of forming the organic light-emitting layers 113.

The organic light-emitting layers 113 are formed by using an ink jet method. In cross sections (a) in FIG. 10 and cross section (c) in FIG. 12, an ink jet head 170 of a printing device is shown. The ink jet head 170 has a plurality of nozzles 171 aligned in the X axis direction and is moved in the Y axis direction, while injecting the ink 172 containing organic light-emitting material from the nozzles 171 into regions adjacent between first banks 111. Note that each nozzle 171 injects the ink 172 of a corresponding color.

Due to the surface tension, the applied ink 173 bulges out between the first banks 111 and defines a curved upper surface profile (FIG. 10(b)). Since the first banks 111 are liquid repellent, the ink 173 is repelled away from the first banks 111 to be held in place, rather than flowing across the first banks 111. This arrangement is to prevent the ink 173 of different colors applied to cell regions 100a adjacent in the X axis from being mixed by flowing across the first banks 111.

The ink 173 being applied flows across the second banks 121 and pooled to form strips of ink each continuously extending in the Y axis direction (FIG. 12(d)). Because the ink 173 is allowed to flow in the Y axis direction, the amount of ink is ensured to be uniform among a plurality of cell regions 100a adjacent in the Y axis direction The applied ink 173 is dried into a plurality of organic light-emitting layers 113 having a predetermined thickness (FIG. 10(c) and FIG. 12(e)). Note that the organic light-emitting material 129 accumulated in each recess 127 formed in the second banks 121 is ensured not to emit light for the reason described above.

(5) Process of Forming Cathodes

The following now describes a process of forming the cathodes 114.

First, by a method such as sputtering or vacuum deposition, a material of cathodes is deposited on the organic light-emitting layers 113 and on other components to form the cathodes 114 (FIG. 10(c) and FIG. 12(e)). Note that a sealing film may be additionally formed on the cathodes 114 by a vacuum deposition method. Alternatively, a sealing layer may be formed by injecting resin between the cathodes 114 and a sealing substrate disposed on the layer of the cathodes 114 (not shown in the figures). Alternatively, an inert gas may be enclosed between the cathodes 114 and a sealing substrate disposed on the layer of the cathodes 114 (not shown in the figures).

In the present embodiment, the process of forming the planarizing film corresponds to the "first process" mentioned above. In addition, the process of forming banks corresponds to the "second process" mentioned above.

6. Effects and Advantages

The display panel 1 of the present embodiment is formed by a line-bank scheme according to which the first banks 111 are formed to extend straight to partition the plurality of light-emitting cells 100 into stripes extending in the Y axis direction. The second banks 121 formed to partition the light-emitting cells 100 in the X axis direction are lower in height than the first banks 111. By virtue of this configuration, the ink 173 applied to form the organic light-emitting layers 113 is allowed to flow across the second banks 121, so that the amount of ink 173 is ensured to be uniform among a plurality of cell regions 100a arrayed in the Y axis direction (FIG. 12(d)). In the case where the ink 173 is not enabled to flow across the second banks 121, it is necessary to adjust the amount of ink 173 to be applied to the respective arrays of cell regions 100a. Yet, such adjustment may result in variations in the amounts of ink among the respective arrays of cell regions 100a.

According to the present embodiment, however, the ink 173 is allowed to flow across the second banks 121. Therefore, the thickness of the organic light-emitting layers 113 expected after draying is readily adjusted. The following considers a case where the ink 173 cannot flow across the second banks 121. In that case, for example, one extra drop or one less drop of the ink 173 into each cell region 100a results in a relatively large difference in thickness of the organic light-emitting layers 113, so that it is difficult to form the organic light-emitting layers 113 of an intended thickness. In contrast, according to the display panel 1 of the present embodiment, the thickness of the organic light-emitting layers 113 is finely adjusted, by adjusting the volumetric capacity of each recess 122 to in turn adjust the volume of the organic light-emitting material 129 that accumulates in the recesses 127 in the second banks 121.

Further, according to the display panel 1 of the present embodiment, the planarizing film 103 has recesses 123 formed therein and the second banks 121 are each formed above one of the recesses 123. This arrangement permits simultaneous formation of the first banks 111 and the second banks 121 of different heights, without the need to change the amount of light exposure. Because of the above advantage, it is not required to use the multi-tone mask 140 in the exposure process of the banks 111 and 112. Consequently, it is not required to use a bank material that is suitable for the multi-tone mask 140. That is, a bank material to be used can be selected from a wider variety of materials and less limitations are required relating to the bank material. Naturally, it is possible to use the multi-tone mask 140 and form the second banks 121 one on each recess 123.

Note that it is a general practice to form recesses/holes of different depths in the planarizing film 103 with the use of a multi-tone mask. Therefore, it is easy to form in the planarizing film 103 a recess at the same time with a contact hole, which is necessarily fanned. In other words, the banks 111 and 121 of two different heights are formed at the same time, without increasing the manufacturing steps. In the present embodiment, each recess 122 has a contact-hole portion 125. That is, each recess 122 has the function of a contact hole.

Further, in the display panel 1 according to the present embodiment, each anode 112 extends through the cell region 100a to reach inside the recess 123. Part of each anode 112 located inside the recess 123 is covered by a second bank 121 and thus does not contribute to cause the organic light-emitting layer 113 to emit light. Here, consideration is given to a case where the edge portion 112b of each anode 112 is located within a cell region 100a. In that case, the second banks 121 need to be disposed to cover the edge portion 112b of each anode 112 in order to prevent local current flow (or shorting). This arrangement, however, may reduce the exposed area of the anodes 112, which in turn reduces the area that contributes to the light emission.

In contrast, according to the present embodiment, each of the edge portions 112a and 112b is located within a recess 123, so that the exposed area of each anode 112 is not reduced and thus the area contributing to the light emission is increased.

Since edge portions 112a and 112b of each anode 112 are located within different recesses 123, the anode 112 has bend portions 112d each along the peripheral edge of a corresponding recess 123. Yet, each second bank 121 is wider than a recess 123 to reliably cover the bend portions 112d of the anodes 112, so that electric current into localized regions of the light emission layers is prevented.

Further, in plan view of the display panel 1 according to the present invention, each contact-hole portion 125 is located within a region where a recess 122 is formed. In the case where a recess and a contact hole are formed in separate regions, the area of resulting cell region 100a is smaller. However, by forming each contact-hole portion 125 within a recess 122, the reduction of area size of each cell region 100a is avoided.

<Modification 1>

Figure 14:
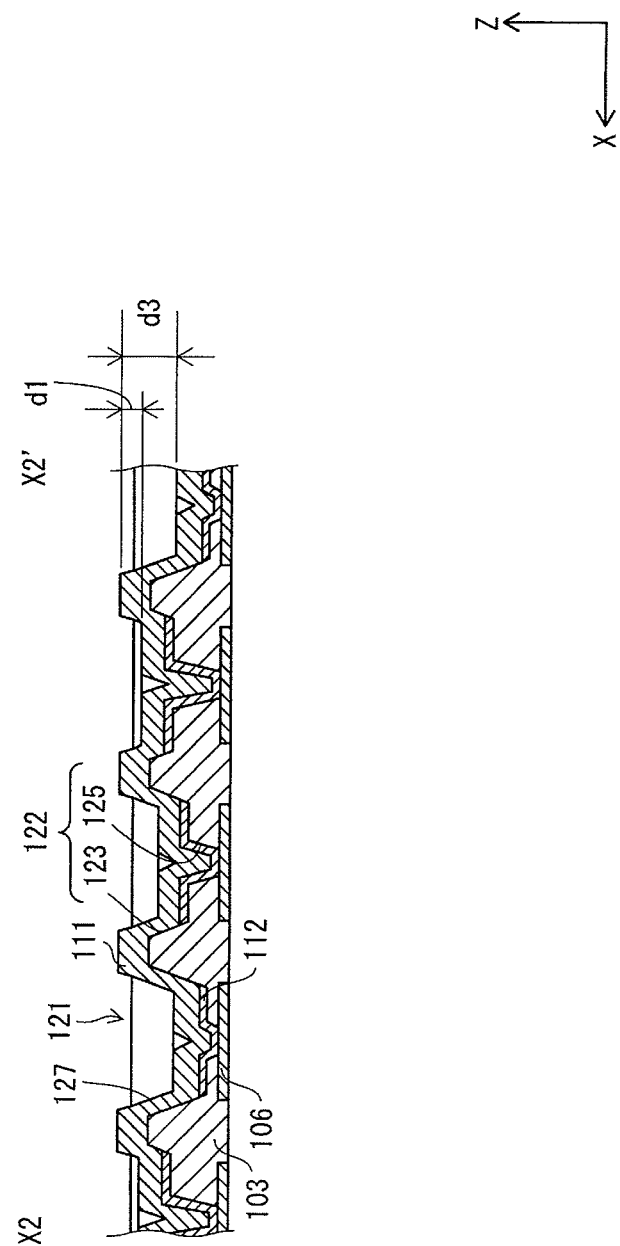
FIG. 14 shows a schematic cross-section illustrating steps illustrating configurations of the banks 111 and 121 of the image display unit 10 according to modification 1.
Figure 15:
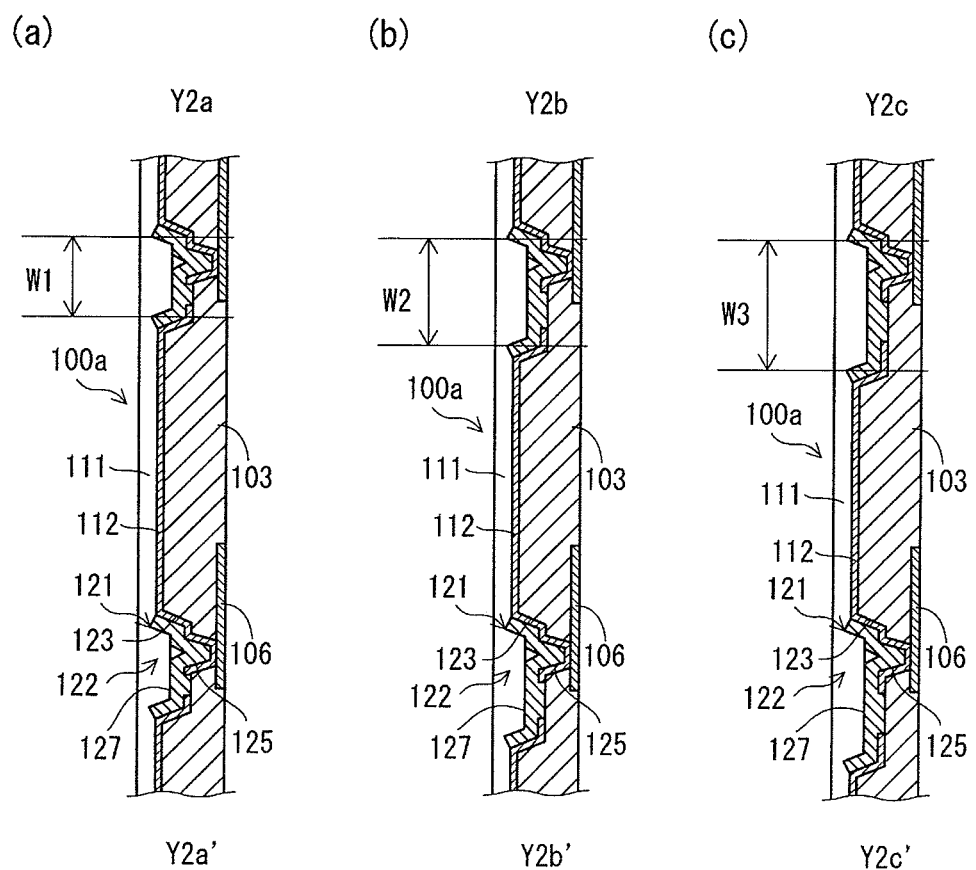
FIG. 15 shows schematic cross-sections illustrating configurations of the banks 111 and 121 of the image display unit 10 according to modification 1.

The configuration of the recesses 127 to be formed in the second banks 121 may be readily modified by altering the configuration of the box-shaped portions 123. FIGS. 14 and 15 each show an example in which the respective recesses 127 formed in the second banks 121 have different depths D and widths W, as a result that the respective box-shaped portions 123 are formed to have different depths and widths. As a result of changing the depth and width, the capacity of each recess 127 (the volume of the space present in the recess 127) changes, so that the amount of organic light-emitting material 129 that accumulates in the recess 127 increases or decreases accordingly.

Note that although the organic light-emitting material 129 accumulates in the recesses 127, the organic light-emitting material 129 does not contribute to emission of light since no electric current is supplied thereto. Yet, by changing the amount of the organic light-emitting material 129 to be accumulated in each recess 127, the thickness of the organic light-emitting layers 113 is adjusted. For example, consider the case of adjusting the thickness of organic light-emitting layers 113 separately for each of R, G B colors. By forming the recesses 127 to have different volumes for the respective colors of red, green and blue, the thickness of the organic light-emitting layers 113 are adjusted suitably for each color without the need to adjust the amount of respective colors of ink 172. By adjusting the organic light-emitting layers 113 into different thicknesses for the respective colors, the luminance and chromaticity are adjusted suitably for the respective colors. It is not necessary that the organic light-emitting layers 113 of the respective colors are all different. For example, the organic light-emitting layers 113 for two of the three colors may have the same thickness.

In one exemplary way of forming the box-shaped portions 123 with different depths, the multi-tone mask 140 may be provided with a plurality of semi-transmission portions 142 having different degree of light transmission. Here, the semi-transmission portions having the higher light transmittance need to be provided at locations corresponding to where deeper box-shaped portions are to be formed, whereas the semi-transmission portions having the lower light transmittance need to be provided at locations where shallower box-shaped portions are to be formed. Through the light exposure process and the developing process performed with such a multi-tone mask, recesses having different depths are formed at the same time. Note that a deeper recess may be made to penetrate the planarizing film 103.

The box-shaped portions 123 may be formed to have different widths (i.e., area sizes), for example by providing the multi-tone mask 140 with semi-transmission portions 142 having different widths.

Further, the box-shaped portions 123 formed for the respective colors may be different in both depth and width.

According to this modification, although the box-shaped portions 123 are formed to have different depths and/or widths, the shape and size of the bottom opening of each contact-hole portion 125 are left unchanged. With this arrangement, there is no need to change the conductivity of the anodes and of the TFT layers 102.

<Modification 2>

Each second bank 121 has a pair of inclined surface 121b opposing in the Y axis direction. The edge portion of each inclined surface 121b facing toward a cell region 100a delimits one of the lateral surfaces of an organic light-emitting layer 113 opposing in the Y axis direction. In modification 2, the inclination angle of each inclined surface 121b may be made different for the respective colors of red, green and blue.

Figure 16:
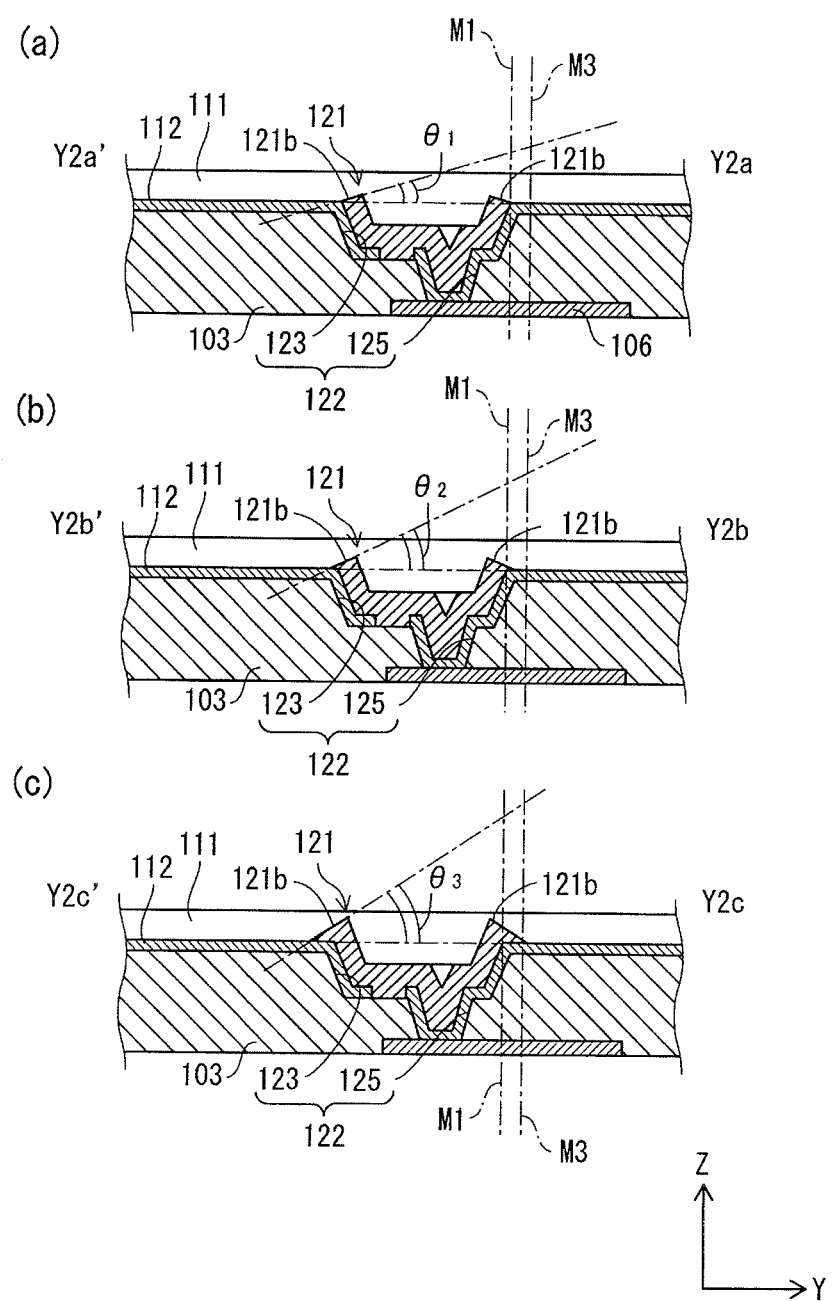
FIG. 16 shows schematic cross-sections illustrating configurations of the banks 111 and 121 of the image display unit 10 according to modification 2.

FIG. 16 shows examples (a), (b) and (c) having the inclined surfaces 121b at one of different inclination angles θ1, θ2, and θ3.

The inclination angle of each inclined surface 121b is adjusted by adjusting the length of the second bank 121 in the Y axis direction relatively to the box-shaped portion 123. For example, as shown in FIG. 16(a), each second bank 121 may be arranged to be shorter in length in the Y axis direction, so that a smaller portion of the second bank 121 extends beyond the box-shaped portion 123 in the Y axis direction in plan view. With this arrangement, the second banks 121 undergo larger deformation through a firing process (see FIG. 13(b)) and thus each inclined surface 121b after the firing will have a smaller inclination angle. Reversely, as shown in FIG. 16(c), each second bank 121 may be arranged to be longer in length in the Y axis direction, so that a larger portion of the second bank 121 extends beyond the box-shaped portion 123 in the Y axis direction in plan view. With this arrangement, the second banks 121 undergo smaller deformation through a firing process and thus each inclined surface 121b after the firing will have a larger inclination angle. In the example (b) shown in FIG. 16, the amount of the portion of the second banks 121 extended beyond the box-shaped portion 123 falls between the amounts shown in (a) and (c), so that the inclination angle of the inclined surface 121b after the firing also falls between the inclination angles shown in (a) and (c).

Note that in the figure, the straight lines M1 and M3 visually represent the difference in the amounts of the portions of the second banks 121 extending beyond the box-shaped portion 123.

The inclined surfaces 121b formed at suitable inclination angles for the respective colors of the ink 172 are effective, for example, in preventing variations in thickness of the organic light-emitting layers 113 to be formed after drying, so that the organic light-emitting layers 113 are more reliably formed into suitable configuration.

More specific description is given below. Immediately after the application to a plurality of cell regions 100a and other components, the ink 173 is pooled to form strips of ink each continuously extending in the Y axis direction (see FIG. 12(d)). As the ink 173 dries and the liquid level of the ink 173 becomes lower than the second banks 121, the ink 173 is partitioned by the second banks 121 into regions above the cell regions 100a and regions above the recesses 127. If the inclined surfaces 121b of the second banks 121 are liquid repellent and the ink 173 in the process of drying still have some degree of fluidity, the liquid surface of the ink 173 located above each cell region 100a defines a curved profile due to its surface tension. Here, the degree of the curvature is suitably regulated by suitably adjusting the inclination angle of the inclined surface 121b, so that the organic light-emitting layers 113 formed after drying are ensured to have suitable configuration. The inclination angles of the inclined surfaces 121b can be suitably determined depending on, for example, the viscosity and the surface tension of the respective colors of ink 172. It is not necessary that the angles of the inclined surfaces 121b of the second banks 121 are all different for each of the three colors of the organic light-emitting layers 113. For example, the inclination angles of the inclined surfaces 121b for the two of the three colors may be the same. In the manner described above, the inclination angles can be set suitably in view of the properties of the ink 172 of the respective colors to be used, which allows selection of ink from a wider variety of options.

Note that Patent Application Publication No. JP 2007-311235 discloses a technique of preventing variations in thickness of organic light-emitting layers by providing lyophilic ridges on the surface of the banks to regulate pinning locations of the ink. In contrast, in the display panel 1 according to this modification, the pinning locations of the ink are regulated with the inclined surfaces 121b of the second banks 121 suitably formed at different inclination angles, so that variations in thickness of the organic light-emitting layers are prevented.

<Modification 3>

According to the embodiment described above, each organic light-emitting layer 113 is sandwiched between an anode 112 and a cathode 114. It is applicable to additionally provide a hole injection transporting layer between the anode 112 and the organic light-emitting layer 113 and provide an electron injection layer between the organic light-emitting layer 113 and the cathode 114.

Figure 17:
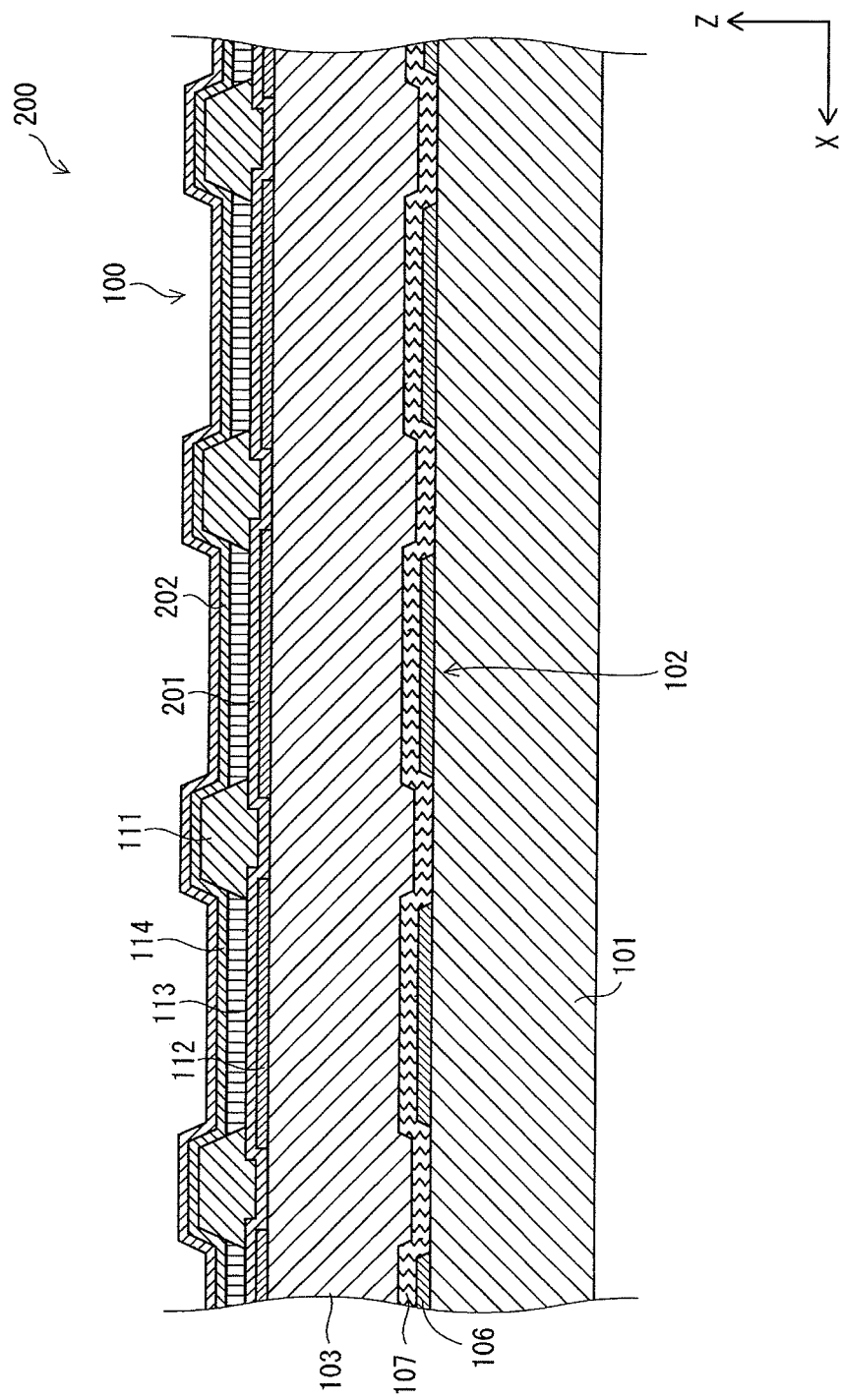
FIG. 17 shows a schematic cross-section illustrating configurations of the light-emitting cells 100 of the image display unit 10 according to modification 3.

FIG. 17 schematically shows a cross section of a light-emitting cell 100, taken along the line A-A' shown in FIG. 1 An image display unit 200 according to modification 3 includes anodes 112 and a hole injection transporting layer 201 stacked on the anodes 112. The image display unit 200 according to modification 3 also includes organic light-emitting layers 113 and an electron injection layer 202 stacked on the organic light-emitting layers 113.

The hole injection transporting layer 201 has the function of assisting with hole generation and of injecting and transporting holes stably into the organic light-emitting layer 113. The hole injection transporting layer 201 has a high work function. The hole injection transporting layer 201 is a layer of a metal oxide such as silver (Ag), molybdenum (Mo), chromium (Cr), vanadium (V), tungsten (W), nickel (Ni), iridium (Ir), etc. When the hole injection transporting layer 201 is formed from an oxide of a transition metal, a plurality of levels can be occupied since there are a plurality of oxidation numbers. This makes hole injection easy and allows for reduction of driving voltage. Note that in addition to forming the hole injection transporting layer 201 with the above-described metal oxides, PEDOT (a mixture of polythiophene and polystyrene sulfonic acid), phthalocyanine-based polymer, triarylamine-based polymer, triphenylamine-based polymer or the like may also be used.

The hole injection transporting layer 201 is formed after the process of forming anodes and before the process of forming banks. The hole injection transporting layer 201 is formed on the planarizing film 103 and the anodes 112, by a method as sputtering method, a vacuum deposition method or the like. To form the hole injection transporting layer 201 from a metal oxide, a metal film is formed on the planarizing film 103 and the anodes 112. Subsequently, the metal film is oxidized to form the hole injection transporting layer 201.

Each electron injection layer 202 has the function of transporting electrons that are injected through the cathodes 112 to the organic light-emitting layers 113 and is preferably formed, for example, of barium or lithium fluoride.

The electron injection layer 202 is formed after the process of forming organic light-emitting layers and before the process of forming cathodes. Films of the material(s) mentioned above are deposited by a vacuum deposition method or the like, on the organic light-emitting layers 113 and the banks 112 and 121.

Similarly to the embodiment and modifications described above, the image display unit 200 according to this modification has the second banks 121 each formed above a recess 122 in the bank forming process, so that the first banks 111 and the second banks 121 of different heights are formed at the same time, without the need to change the amount of light exposure. Consequently, modification 3 also achieves the effects and advantages described regarding the above embodiment. In addition, since the image display unit 200 according to this modification additionally have the hole injection transporting layer 201 and the electron injection layer 202, the supply of electric charges (holes and electrons) to the organic light-emitting layers 113 is balanced. As a consequence, the luminous efficiency is further improved.

Note that in this modification, the hole injection transporting layer 201 is formed to entirely cover the planarizing film 103. Yet, it is applicable to form the hole injection transporting layers 201 only on regions of the planarizing film 103 above the anodes 112. In the case where the anodes 112 are reflecting electrodes, an electrode coating layer made of an ITO (indium tin oxide) film or the like may be additionally provided between each anode 112 and the hole injection transporting layer 201. In addition, the electron injection layer 202 may be omitted in this modification. Note in this modification, the bottom surface of each box-shaped portion is at a lower height than the bottom surface of each first bank 111 and also at a lower height than the under surface of the hole injection transporting layer 201 provided below the top surface 111b of each first bank 111.

<Modification 4>

According to the embodiment and modifications described above, each recess 122 is composed of a box-shaped portion 123 and a contact-hole portion 125. In this modification, the box-shaped portion 123 may be made deeper to have an opening in the lower surface of the planarizing film, so that the capacity of the recess 122 is maximized.

Figure 18:
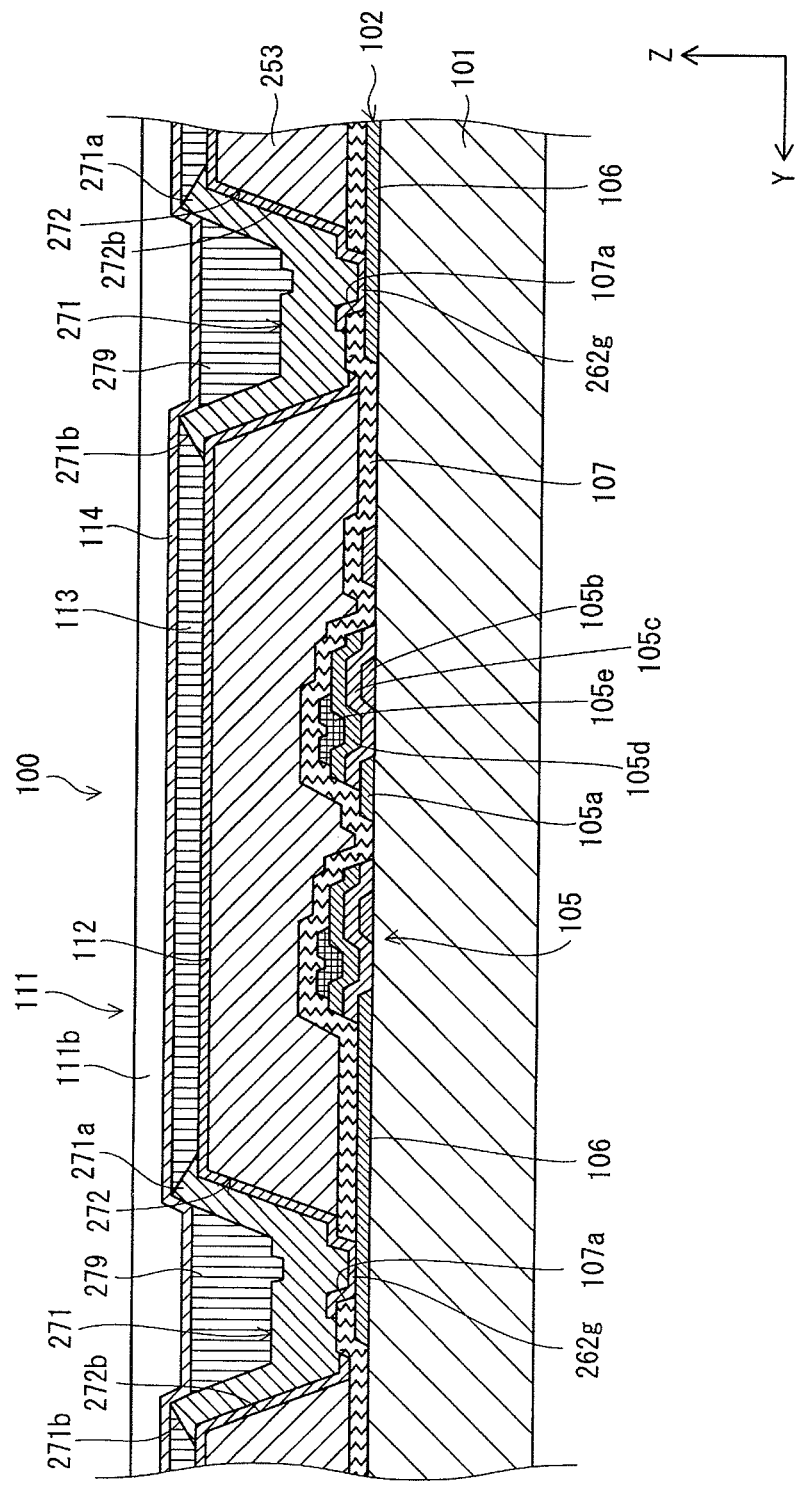
FIG. 18 shows a schematic cross-section illustrating configurations of the light-emitting cells 100 of the image display unit 10 according to modification 4.

FIG. 18 is a view showing a cross section of a display panel according to modification 4 (corresponding to the B-B' cross section shown in FIG. 2). The major part of this modification is similar to the embodiment described above, except for the configurations of the planarizing film and the second banks.

Therefore, the same reference sings are used to denote similar components and the following describes different components.

A planarizing film 253 is provided with recesses 272 each having the shape of a substantially trapezoidal pyramid. Each recess 272 has a top opening having a similar shape to the top opening of each recess 122 according to the above embodiment. The bottom surface 272a of each recess 272 is constituted with the upper surface of the passivation film 107. In addition, the four lateral surfaces 272b and 272c of each recess 272 (FIG. 18 shows the lateral surfaces 272b only) are without any step height. Rather, each recess 272 defines such a shape that the lateral surfaces 272b and 272c are continuously inclined inwardly from the top opening toward the bottom opening. Note that the regions where each bottom surface 272a are formed are referred to as the "regions where the planarizing film have been removed" mentioned above.

The recesses 272 are formed by arranging the steps shown in FIGS. 7(a2) and (b2) and FIGS. 11(a) and (b), so that light passing through the transmission portions 141 is directed to the regions roughly corresponding to where the bottom surfaces 272a are to be formed, followed by the developing process. In short, the recesses 272 can be formed by light exposure performed by using a mono-tone mask rather than a multi-tone mask. As described in the steps shown in FIGS. 7(a2) and (b2), the lateral surfaces 272b and 272c are inclined inwardly toward the bottom so that the area of each recess 272 in plan view is continuously smaller toward the bottom due to the diffraction of light at the time of the exposure process.

In addition, each anode 262 located within a recess 272 is partly exposed at the opening 107a of the passivation film 107 and is in contact with an SD electrode 160 at the contact portion 262g. As described above, each recess 272 according to this modification is formed in a region that overlaps with the contact portion 262g in plan view and thus functions as a contact hole as well.

In this modification, each recess 272 is composed of a box-shaped portion 273, and the box-shaped portion 273 functions also as a contact hole. Therefore, it may be considered that box-shaped portion and a contact-hole portion are integrally formed.

In this modification, the "region where the contact hole is formed" mentioned above corresponds to a region in plan view where the contact portion 262g is formed.

Each second bank 271 is shaped to conform to the bottom surface 272a and the lateral surfaces 272b and 272c of the recess 272. Similarly to the second banks 121 according to the above embodiment, each second bank 271 has a pair of ridges 271a and a pair of inclined surfaces 271b. Since each recess 272 is deeper, the volumetric capacity of each recess 277 formed in the upper surface of the second bank 271 is larger than the recess 127 according to the embodiment. Naturally, the volume of the organic light-emitting material 279 accumulates in each recess 277 is larger than the volume of the organic light-emitting material 129 according to the embodiment. In the figures, each organic light-emitting layer 113 is depicted as having the same thickness as the embodiment described above. However, if the same amount of ink is applied, the organic light-emitting layer formed according to modification 4 is thinner than the organic light-emitting layers formed according to the embodiment above.

The second banks 271 and the organic light-emitting layers 113 are formed in the same manner as described in the above embodiment.

According to this modification, the planarizing film 253 having the recesses 272 is formed more easily, since a mono-tone mask can be used in the light exposure process. In addition, this modification allows to maximize the volume of each recess 272, which is advantages in order to increase the volume of the organic light-emitting material 279 accumulated in each recess 277. Note in addition that the four lateral surfaces 272*b* and 272*c* (only the lateral surfaces 272*b* are shown in the figure as representatives) of each recess 272 are all planar but the present invention is not limited to such. That is, each lateral surface of the recesses 272 may be curved at least partially. Alternatively, the lateral surfaces of each recess 272 may be entirely curved to define, for example, a bowl-like shape.

<Modification 5>

According to the embodiment and modifications described above, edges of each recess (122 etc.) in the X axis direction are located below lateral surfaces 111*a* of first banks 111. Alternatively, however, the recess may be formed such that the edges in the X axis direction are located inwardly of the locations below the lateral surfaces of the first banks.

Figure 19:
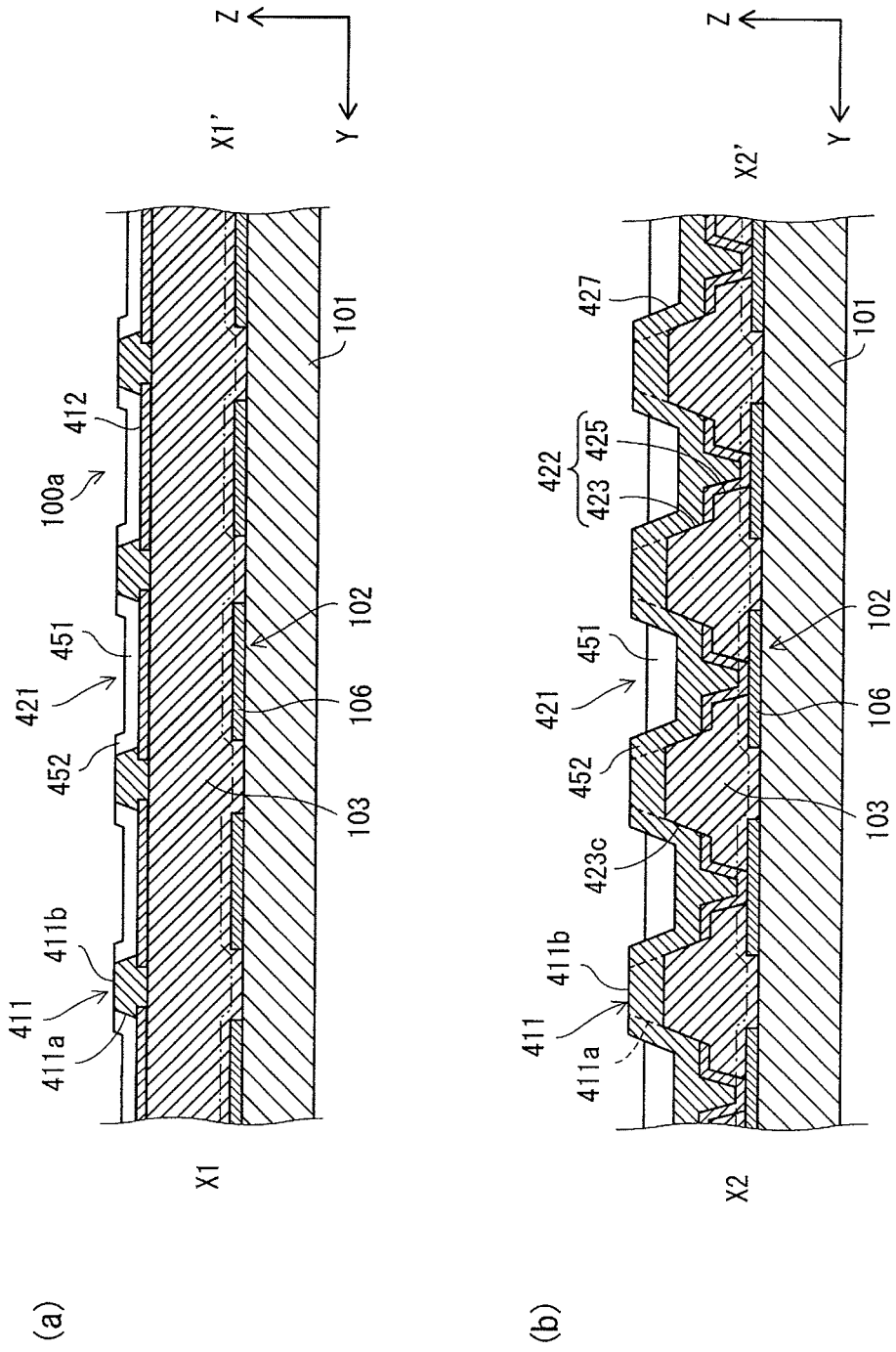
FIG. 19 shows schematic cross-sections illustrating configurations of the light-emitting cells 100 of the image display unit 10 according to modification 5.

FIG. 19 shows different cross sections (a) and (b) of a display panel according to modification 5 (the cross section (a) corresponds to the X1-X1' cross section shown in FIG. 4, whereas the cross section (b) corresponds to the X2-X2' section shown in FIG. 4). In the figure, the organic light-emitting layers and the cathodes are omitted.

The major part of this modification is similar to the embodiment described above, except for the configurations of the planarizing film and second banks. Therefore, the same reference sings are used to denote similar components. The following describes different components.

In this modification, each recess 422 has a pair of edges (upper edges of the lateral surfaces 423*c*) opposing in the X axis direction, and each of the edges reaches as far as a location below the lower edge of the lateral surface 411*a* of a first bank 411. That is, the pair of edges is not located below the lateral surfaces 411*a*. Therefore, each second bank 421 is formed to have a low-height region 451 in the longitudinal center of the second bank 421 and also have high-height regions 452 at the longitudinal edges of the second bank 421. The low-height region 451 is lower in height than the first banks 111, whereas the high-height regions 452 are the same height as the first banks 111. As a result, the low-height regions 451 of the second banks 421 are shorter in length in the X axis direction as compared with the second banks 121 described in the above embodiment. This configuration may be inferior to the second banks 121 according to the above embodiment, from the viewpoint of improving the flowability of ink. Yet, this configuring is superior to the above embodiment, from the viewpoint of more reliably ensuring that the top surface 411*b* of each first bank 411 is at a sufficient height.

According to this modification, in addition, the volumetric capacity of each recess 422 is made smaller. More specifically, the size of the contact-hole portion 425 is retained the same as the above embodiment, but the volumetric capacity of the box-shaped portion 423 is reduced. As a result of the reduction of the capacity of each box-shaped portion 423, the recess 427 formed in the upper surface of the second bank 421 is reduced accordingly.

Although not clear, the boundaries of each first bank 411 with second banks 421 are defined by extending the boundaries of the first bank 411 with cell regions 100*a*. In FIG. 19(*b*), the lateral surfaces 411*a* of the first banks 411 are shown with broken lines. In FIG. 19(*b*), the portions other than the first banks 411 are defined to be the second banks 421.

Note that the high-height regions 452 may be considered to be part of the first banks 411, rather than of the second banks 421. In that case, the first banks 411 according to this modification may be considered to have different widths (lengths in the X axis direction), rather than one uniform width. More specifically, each first bank 411 is considered to be wider at portions adjacent to second banks 421. In that case, it is then true that each recess 422 has a pair of opposing edges each of which is located below the lateral surface 411*a* of a first bank 411.

[Supplemental Note]

Figure 20:
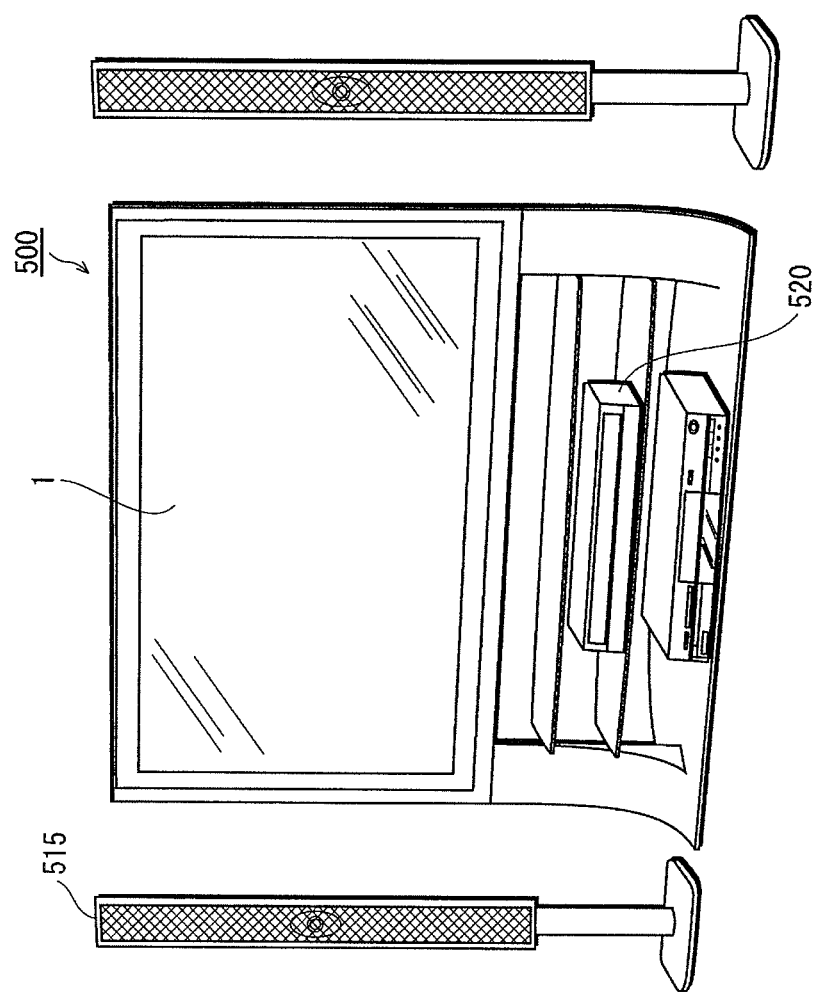
FIG. 20 shows an external perspective view of an organic EL display device 500 that includes the organic EL display panel 1.
Figure 21:
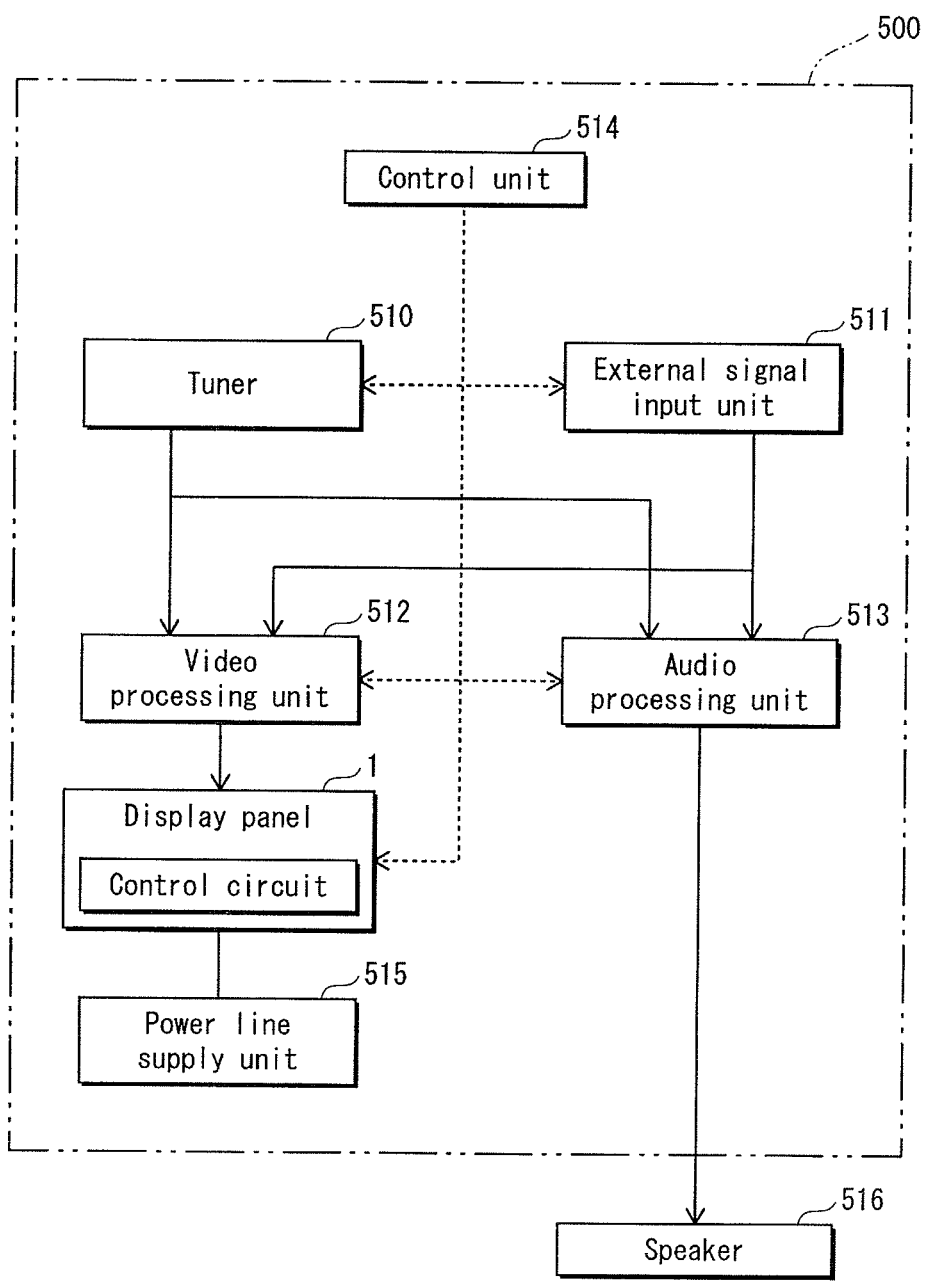
FIG. 21 is a block diagram illustrating a configuration of an important part of the organic EL display device 500.

1. The display panel 1 described above in the embodiment and modifications is usable for a display device such as a television receiver. FIG. 20 shows an organic EL display device 500 (hereinafter referred to simply as the display device 500) having the display panel 1. Further, FIG. 21 is a block diagram showing the major components of the display device 500. The display device 500 includes, in addition to the display panel 1, a tuner 510, an external signal input unit 511, a video processing unit 512, an audio processing unit 513, a control unit 514, and a power line supply unit 515 that feeds power to the display panel 1. In addition, the display device 500 is connected to a speaker 516 that is provided internally or externally.

In the display device 500, a signal received by the tuner 510 is separated into a video signal and an audio signal by a demodulation and separation circuit (not shown). Then, the video signal is passed to the video processing unit 512 and the audio signal to the audio processing unit 513. The video processing unit 512 composites the video signal to generate a signal representing frame images and sequentially transmits the resultant signal to the display panel 1 at a predetermined cycle. The control circuit 25 included in the display panel 1 controls at least the signal line driving circuit 21 and the scan line driving circuit 23 based on the frame image signal, so that the image display unit 10 sequentially displays frame images one by one. The audio processing unit 513 composites and amplifies the audio signal and outputs the resultant signal to the speaker 516.

The external signal input unit 511 is connected, for example, to an external video playback device, such as a DVD recorder 520 and receives input of video and audio signals from the video playback device. Under control of the control unit 514, each of the video processing unit 512 and the audio processing unit 513 selectively outputs either the signal from the tuner 510 or the signal from the external signal input unit 511 to the display panel 1 and other components.

The control unit 514 includes a CPU (Central Processing Unit), ROM and RAM and controls the respective component units in accordance with operational commands received via a remote controller and operational switches (not shown), so that the display device 500 achvies various operations.

With the display panel 1 according to any of the embodiment and modifications described above, the display device 500 also achieves the same effects and advantages described regarding the above embodiment and modifications.

2. In the above embodiment and modifications 1-5, the respective components are employed merely by way of example in order to clearly illustrate the configurations of the present invention and the effects and advantages thereof. Except for its essential part, the present invention is not limited to the above configurations. For example, the embodiment described above is directed to a configuration in which the anodes 112 are located below the organic light-emitting layers 113 in the Z axis direction as shown in FIG. 2. However, the present invention is not limited to such a configuration. In an alternative configuration, the cathodes 114 may be located below the organic light-emitting layers 113.

3. The embodiment and modifications 1-5 described above may be further modified to employ a top-emission structure in which the anodes 112 are made of reflective metal and the cathodes 114 are made of transparent or semi-transparent metal. Alternatively, a bottom-emission structure may be employed in which the anodes are made of transparent or semi-transparent metal and the cathodes 114 are made of reflective metal.

4. Although the embodiment and modifications 1-5 described above are directed to an active-matrix panel having the TFT layers 102 on the substrate, the present invention is also applicable to a passive-matrix panel. In the case of passive-matrix, it is not necessary to provide the TFT layers, and electric current is supplied to the organic light-emitting layers via the wiring for operating the organic light-emitting layers.

INDUSTRIAL APPLICABILITY

The present invention is useful for achieving a display device capable of displaying images with even luminance and high quality.

What is claimed is:

1. An organic EL display panel, comprising:
a wiring layer;
a planarizing film above the wiring layer;
a plurality of light-emitting cells in a row;
a pair of first banks above the planarizing film to delimit lateral surfaces of the plurality of light-emitting cells;
a plurality of organic light-emitting layers, each of the plurality of organic light-emitting layers being located in one of the plurality of light-emitting cells between the pair of first banks; and
a plurality of second banks, wherein
the planarizing film includes a plurality of recesses, each of the plurality of recesses between adjacent ones of the plurality of light-emitting cells and extending between the pair of first banks,
the pair of first banks and the plurality of second banks are connected and each comprise a same material, and
each of the plurality of second banks is above one of the plurality of recesses in the planarizing film and has a shape that conforms to a profile of the one of the plurality of recesses so that the plurality of second banks are lower in height than the pair of first banks.

2. The organic EL display panel according to claim 1, wherein
each of the plurality of recesses in the planarizing film has a bottom that is lower than a bottom of each of the pair of first banks.

3. The organic EL display panel according to claim 1, further comprising:
a plurality of cell-electrode layers, one of the plurality of cell-electrode layers being provided for each of the plurality of light-emitting cells, between the planarizing film and a corresponding one of the plurality of organic light-emitting layers, wherein
part of an edge portion of each of the plurality of cell-electrode layers is located inside a corresponding one of the plurality of recesses formed in the planarizing film, and
each of the plurality of second banks covers the part of the edge portion of a corresponding one of the plurality of cell-electrode layers located in the corresponding one of the plurality of recesses formed in the planarizing film.

4. The organic EL display panel according to claim 3, wherein
the planarizing film has a plurality of contact holes, each of the plurality of contact holes interconnecting a corresponding one of the plurality of cell-electrode layers and the wiring layer, and
each of the plurality of contact holes overlaps with one of the plurality of recesses in a vertical direction.

5. The organic EL display panel according to claim 4, wherein
at least a portion of each of the plurality of recesses that overlaps with one of the plurality of contact holes extends through the planarizing film, and
each of the plurality of cell-electrode layers is in contact with the wiring layer via a corresponding one of the plurality of contact holes.

6. The organic EL display panel according to claim 4, further comprising:
an insulating protection film disposed between an upper surface of the wiring layer and a lower surface of the planarizing film, wherein
the insulating protection film includes openings that each coincide with at least a portion of one of the plurality of contact holes, and
an area of each of the openings in the insulating protection film is less than an area of each of the plurality of recesses in the planarizing film.

7. The organic EL display panel according to claim 4, wherein
a planar area of a top opening of each of the plurality of recesses is greater than a planar area of a top opening of a corresponding one of the plurality of contact holes, whereby the top opening of each of the plurality of recesses overlaps with the top opening of the corresponding one of the plurality of contact holes.

8. The organic EL display panel according to claim 3, wherein
each of the plurality of cell-electrode layers includes a bend that coincides with a peripheral edge of a corresponding one of the plurality of recesses, and
each of the plurality of second banks extends beyond the one of the plurality of recesses so that the plurality of second banks cover the bend in each of the plurality of cell-electrode layers in a direction in which the pair of first banks extends.

9. The organic EL display panel according to claim 3, wherein
each of the plurality of cell-electrode layers comprises at least one of a metal and a semiconductor.

10. The organic EL display panel according to claim 1, wherein
each of the plurality of recesses in the planarizing film is not below the pair of first banks.

11. The organic EL display panel according to claim 1, wherein
each of the plurality of recesses in the planarizing film has an edge below a lateral surface of the pair of first banks.

12. The organic EL display panel according to claim 1, wherein
the pair of first banks extends linearly.

13. The organic EL display panel according to claim 1, wherein
the plurality of organic light-emitting layers in the plurality of light-emitting cells each comprise a light-emitting material of a same color.

14. The organic EL display panel according to claim 1, wherein
each of the plurality of recesses has a top opening that defines an upper opening in an upper surface of the planarizing film and a bottom opening that defines a bottom opening in a bottom surface of the planarizing film, and a planar area of each of the plurality of recesses decreases one of continuously and stepwise from the top opening to the bottom opening.

15. The organic EL display panel according to claim 1, wherein the pair of first banks comprises at least three pairs of first banks, each of the at least three pairs of first banks corresponds to a different one of a red color, a green color, and a blue color, and the plurality of organic light-emitting layers, the plurality of recesses, and the plurality of second banks are disposed between each of the at least three pairs of first banks.

16. The organic EL display panel according to claim 15, wherein each of the plurality of recesses in the planarizing film comprises a first recess, each of the plurality of second banks is concave and includes a second recess in an upper surface, an organic light-emitting material being the same as a material of the plurality of organic light-emitting layers is in the second recess of each of the plurality of second banks, and first volumetric capacities of the first recess and the second recess formed between one of the at least three pairs of first banks are different than second volumetric capacities of the first recess and of the second recess formed between an other of the at least three pairs of first banks.

17. The organic EL display panel according to claim 15, wherein each of the plurality of recesses in the planarizing film comprises a first recess, each of the plurality of second banks is concave and includes a second recess in an upper surface, an organic light-emitting material being the same as a material of the plurality of organic light-emitting layers is in the second recess of each of the plurality of second banks, and first areas of the first recess and the second recess formed between one of the at least three pairs of first banks are different than second areas of the first recess and of the second recess formed between an other of the at least three pairs of first banks.

18. The organic EL display panel according to claim 15, wherein each of the plurality of recesses includes:
  an upper recess portion having a top opening that defines an upper opening in an upper surface of the planarizing film; and
  a lower recess portion having a bottom opening that defines a bottom opening in a lower surface of the planarizing film, an area of the upper recess portion decreases from the top opening toward the bottom opening, an area of the lower recess portion increases from the bottom opening toward the top opening, each of the plurality of recesses includes a step between the upper recess portion and the lower recess portion, a cell-electrode layer extends from each of the plurality of light-emitting cells to a corresponding one of the plurality of recesses and is in electrical connection with the wiring layer via the bottom opening of the corresponding one of the plurality of recesses, one of a first depth and a first area of the individual upper recess portion between one of the at least three pairs of first banks is different than a corresponding one of a second depth and a second area of the upper recess portion between an other of the at least three pairs first banks, and the bottom opening of each of the plurality of recesses between each of the at least three pairs of first banks is uniform.

19. The organic EL display panel according to claim 15, wherein each of the plurality of second banks includes an inclined surface that delimits a lateral surface of a corresponding one of the plurality of organic light-emitting layers, the lateral surface extends in a direction opposite the at least three pairs of first banks, and a first inclination angle of the inclined surface of each of the plurality of second banks between one of the at least three pairs of first banks is different than a second inclination angle of the inclined surface of each of the plurality of second banks between an other of the at least three pairs of first banks.

20. The organic EL display panel according to claim 1, wherein the wiring layer comprises a thin-film transistor layer.

21. The organic EL display panel according to claim 1, wherein the organic EL display panel is included in an organic EL display device.

22. A method for manufacturing an organic EL display panel, comprising:

forming a planarizing film above a thin-film transistor layer with a flat surface of the planarizing film being above the thin-film transistor layer;

forming a pair of first banks above the planarizing film to delimit lateral surfaces of a plurality of light-emitting cells disposed in a row;

forming a plurality of light-emitting layers, each of the plurality of light-emitting layers being in one of the plurality of light-emitting cells between the pair of first banks;

forming a plurality of recesses in the planarizing film, each of the plurality of recesses being between adjacent ones of the plurality of light-emitting cells and extending between the pair of first banks; and forming, from a same material as the first banks, a plurality of second banks connected to the first banks, each of the plurality of second banks being above one of the plurality of recesses in the planarizing film and having a shape that conforms to a profile of the one of the plurality of recesses, so that the plurality of second banks are lower in height than the pair of first banks.

23. The method according to claim 22, wherein the pair of first banks and the plurality of second banks are formed by:

applying, to the planarizing film, a bank material for forming the pair of first banks and the plurality of second banks; and exposing the bank material to light via a mask pattern that is patterned to leave the pair of first banks and the plurality of second banks, and each of the plurality of second banks concaves into a corresponding one of the plurality of recesses in the planarizing film by conforming to the inner profile of the corresponding one of the plurality of recesses, so that the plurality of second banks are lower in height than the pair of first banks.

24. The method according to claim 23, wherein
the mask pattern is patterned to leave each of the plurality of second banks to have a planar area that is greater than a planar area of each of the plurality of recesses.

25. The method according to claim 22, wherein
the plurality of recesses are formed by exposing the planarizing film to light via a mask pattern that is patterned to form the plurality of recesses, and
the mask pattern is a multi-tone mask pattern having a plurality of light-transmitting portions with different transmittances.

26. The method according to claim 25, wherein
when forming the plurality of recesses, first regions of the planarizing film where the plurality of recesses are formed are exposed to the light via the multi-tone mask pattern, so that second regions where contact holes are to be formed and surrounding regions are exposed to light at different intensities, whereby each of the plurality of recesses is formed to include a step.

27. The method according to claim 22, further comprising:
the pair of first banks and the plurality of second banks are formed by:
applying, to the planarizing film, a bank material for forming the pair of first banks and the plurality of second banks;
exposing the bank material to light via a mask pattern that is patterned so that regions of the bank material where the pair of first banks and the plurality of second banks are to be formed are exposed to light of a uniform intensity.

28. The method according to claim 22, further comprising:
forming, before forming the pair of first banks and the plurality of second banks, a plurality of cell-electrode layers above the planarizing film, each of the plurality of cell-electrode layers coinciding with one of the plurality of light-emitting cells, wherein
each of the plurality of cell-electrode layers is formed to include a part of an edge portion located inside a corresponding one of the plurality of recesses, and
each of the plurality of second banks is formed to cover the part of the edge portion of a corresponding one of the plurality of cell-electrode layers.

29. The method according to claim 28, wherein
each of the plurality of cell-electrode layers is formed to extend from a corresponding one of the plurality of light-emitting cells to inside a corresponding one of the plurality of recesses after a bend at a location coinciding with a peripheral edge of the corresponding one of the plurality of recesses,
a mask pattern is used to form the plurality of second banks, the mask pattern being patterned to form each of the plurality of second banks as having a planar area that is greater than a planar area of each of the plurality of recesses, and
the plurality of second banks are formed to cover the bend in each of the plurality of cell-electrode layers.

* * * * *